(12) United States Patent
Lavoie et al.

(10) Patent No.: US 8,791,572 B2
(45) Date of Patent: Jul. 29, 2014

(54) BURIED METAL-SEMICONDUCTOR ALLOY LAYERS AND STRUCTURES AND METHODS FOR FABRICATION THEREOF

(75) Inventors: Christian Lavoie, Pleasantville, NY (US); Francois Pagette, Jefferson Valley, NY (US); Anna W. Topol, Jefferson Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 1061 days.

(21) Appl. No.: 11/828,455

(22) Filed: Jul. 26, 2007

(65) Prior Publication Data

US 2009/0026623 A1 Jan. 29, 2009

(51) Int. Cl.
*H01L 23/48* (2006.01)
*H01L 21/4763* (2006.01)

(52) U.S. Cl.
USPC .... 257/773; 257/762; 257/774; 257/E21.495; 257/E23.01

(58) Field of Classification Search
USPC ............ 257/773, 762, 774, E21.495, E23.01; 438/618
See application file for complete search history.

(56) References Cited

U.S. PATENT DOCUMENTS

| | | | |
|---|---|---|---|
| 5,312,772 A | 5/1994 | Yokoyama et al. | |
| 5,907,784 A * | 5/1999 | Larson | 438/592 |
| 6,686,255 B2 | 2/2004 | Yang et al. | |
| 6,706,640 B1 | 3/2004 | Tsai et al. | |
| 6,737,710 B2 | 5/2004 | Cheng et al. | |
| 7,713,792 B2 | 5/2010 | Chinthakinki et al. | |
| 2002/0060346 A1 | 5/2002 | Cheng et al. | |
| 2005/0070082 A1 | 3/2005 | Kammler et al. | |
| 2005/0202664 A1 | 9/2005 | Jawarani | |
| 2005/0208762 A1 * | 9/2005 | Chen et al. | 438/649 |
| 2007/0243662 A1 * | 10/2007 | Johnson et al. | 438/106 |
| 2008/0157381 A1 * | 7/2008 | Ohayashi et al. | 257/758 |
| 2008/0286921 A1 | 11/2008 | Yu et al. | |
| 2009/0096059 A1 | 4/2009 | Chinthakindi et al. | |
| 2009/0108381 A1 * | 4/2009 | Buchwalter et al. | 257/415 |
| 2009/0121261 A1 | 5/2009 | Doris et al. | |
| 2010/0221865 A1 * | 9/2010 | Chang et al. | 438/70 |
| 2012/0223319 A1 | 9/2012 | Dora | |

OTHER PUBLICATIONS

Lateral encroachment of Ni-silicide in the source/drain regions of ultra-thin silicon-on-insulator, Appl. Phys. Lett., 86, 53507-1-9 (2005).
U.S. Notice of Allowance dated Feb. 14, 2014 from related U.S. Appl. No. 13/607,869.

* cited by examiner

*Primary Examiner* — Cathy N Lam
(74) *Attorney, Agent, or Firm* — Scully, Scott, Murphy & Presser, P.C.; Louis J. Percello, Esq.

(57) ABSTRACT

A method for forming a metal-semiconductor alloy layer uses particular thermal annealing conditions to provide a stress free metal-semiconductor alloy layer through interdiffusion of a buried semiconductor material layer and a metal-semiconductor alloy forming metal layer that contacts the buried semiconductor material layer within an aperture through a capping layer beneath which is buried the semiconductor material layer. A resulting semiconductor structure includes the metal-semiconductor alloy layer that further includes an interconnect portion beneath the capping layer and a contiguous via portion that penetrates at least partially through the capping layer. Such a metal-semiconductor alloy layer may be located interposed between a substrate and a semiconductor device having an active doped region.

12 Claims, 23 Drawing Sheets

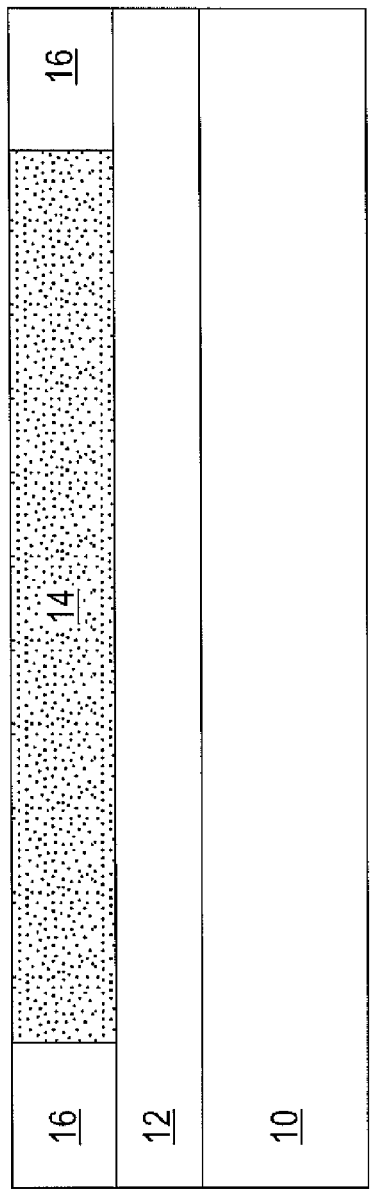
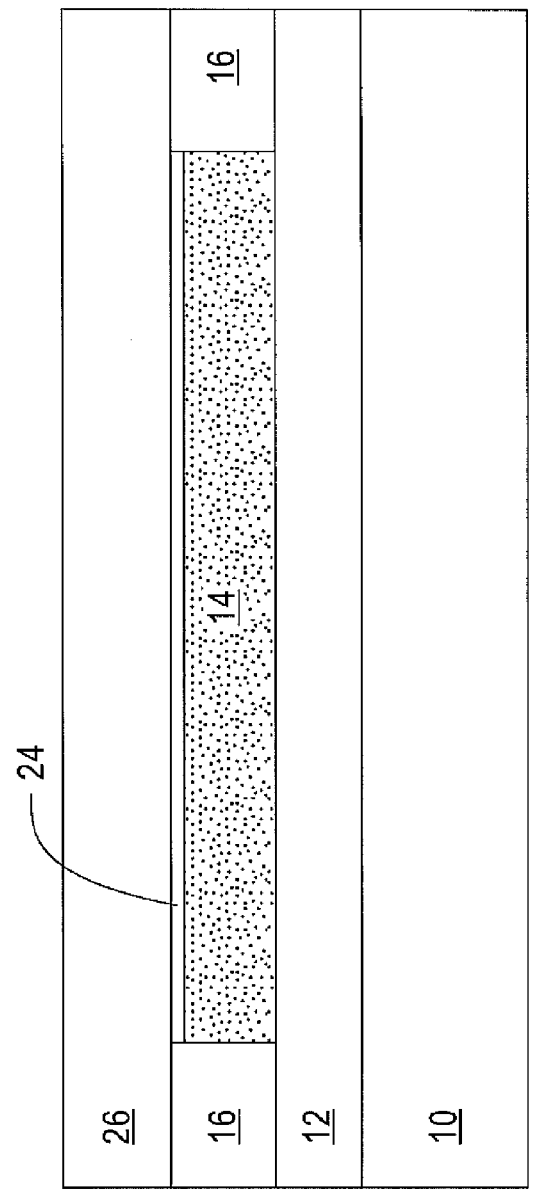

BURIED METAL-SEMICONDUCTOR ALLOY LAYERS AND STRUCTURES AND METHODS FOR FABRICATION THEREOF

BACKGROUND

1. Field of the Invention

The invention relates generally to metal-semiconductor alloy layers within microelectronic structures. More particularly, the invention relates to buried metal-semiconductor alloy layers within microelectronic structures.

2. Description of the Related Art

Microelectronic structures, including in particular semiconductor structures, are typically fabricated using active devices and passive devices including transistors, diodes, resistors and capacitors. The foregoing active devices and passive devices are typically connected and interconnected using patterned conductor layers that are separated by dielectric layers.

As semiconductor technology has advanced, bulk resistances and surface resistances of patterned conductor layers continue to contribute increasingly proportional quantities of patterned conductor layer resistance based time delays within microelectronic circuits, including in particular semiconductor circuits. Since these patterned conductor layer resistance based time delays may under certain circumstances have a tendency to become greater as semiconductor device based time delays become smaller or remain constant, it becomes increasingly important within advanced semiconductor structure fabrication and semiconductor device fabrication to minimize patterned conductor layer resistance based time delays so that improvements in operational speed of semiconductor devices is not compromised.

In an effort in-part to provide reductions in patterned conductor layer resistance based time delays within semiconductor circuits, the use of metal-semiconductor alloy conductor materials and metal-semiconductor alloy contact materials has evolved.

"Metal-semiconductor alloy conductor materials" and "metal-semiconductor alloy contact materials" are intended as metal-semiconductor compounds that in general have a higher conductivity, (i.e., a lower resistivity) than a base semiconductor material from which they may be comprised. Metal-semiconductor alloys of several metals are known. Metal-semiconductor alloys of transition metals are particularly common.

Various aspects and characteristics of metal-semiconductor alloy layers are known in the semiconductor fabrication art.

For example, Seger et al., in "Lateral encroachment of Ni-silicide in the source/drain regions of ultra-thin silicon-on-insulator," Appl. Phys. Lett., 86, 53507-1-9 (2005) teaches differential lateral encroachment of a nickel silicide layer located and formed upon a source/drain region of a field effect transistor as a result of thickness of a nickel layer that is used for fabricating the nickel silicide layer while using a self-aligned silicide (i.e., salicide) method.

In addition, Cheng et al., in U.S. Pat. No. 6,737,710 and U.S. Pub. No. 2002/0060346 teaches a field effect transistor structure including a source/drain region having a dual silicide layer. The dual silicide layer includes a first silicide layer located upon an extension region of the source/drain region and a second silicide layer located upon a contact region of the source/drain region.

Further Jawarani, in U.S. Pub. No. 2005/0202664, teaches a method for fabricating a field effect transistor with inhibited lateral encroachment of a silicide layer upon an electrode region (i.e., source/drain electrode region or gate electrode) thereof. The method includes performing a low temperature silicidation anneal (and unreacted metal etch) prior to an encroachment inhibiting ion implant that is followed by higher temperature silicidation anneal.

Still further, Kammler et al. in U.S. Pub No. 2005/0070082 and World Patent No. WO 2005034225 also teaches a field effect transistor device with a dual silicided source/drain region. The dual silicided source/drain region includes: (1) a buried nickel silicide alloy layer that has superior properties with respect to a silicon interface; and (2) a surface cobalt silicide layer located upon the buried nickel silicide alloy layer and having superior contact resistance properties.

Finally, Chen et al., in U.S. Pub. No. 2005/0208762 teaches a method for fabricating a silicide electrode within a semiconductor device with reduced defects. The method uses a halogen doping of a silicide forming metal from which is formed the silicide electrode, prior to annealing the silicide forming metal with a silicon substrate to form the silicide electrode.

Due to their desirable electrical properties within the context of both reduced bulk resistances and reduced contact resistances, metal-semiconductor alloy layers, such as in particular silicide layers, are likely to be of considerable continued importance when fabricating semiconductor devices and semiconductor structures. Thus, desirable within the semiconductor fabrication art are silicide layers having desirable properties, and methods for fabricating those silicide layers.

SUMMARY

The invention provides microelectronic structures including metal-semiconductor alloy layers, and a related method for fabricating a metal-semiconductor alloy layer that may be used within the semiconductor structures. In an embodiment, the metal-semiconductor alloy layers comprise metal silicide layers.

A particular microelectronic structure in accordance with the invention includes a metal-semiconductor alloy layer located interposed between a substrate and a capping layer. The metal-semiconductor alloy layer includes an interconnect portion beneath the capping layer and a via portion contiguous with the interconnect portion and penetrating at least partially through the capping layer.

Another particular microelectronic structure in accordance with the invention includes a metal-semiconductor alloy layer located interposed between a substrate and a semiconductor device including an active doped junction.

A particular method for forming a metal-semiconductor alloy layer in accordance with the invention includes forming an aperture completely through at least one capping layer that covers a semiconductor material layer located interposed between a substrate and the capping layer. This particular method also includes forming a metal-semiconductor alloy forming metal layer into the aperture and contacting the semiconductor material layer. This particular method also includes thermally annealing the metal-semiconductor alloy forming metal layer and the semiconductor material layer to form a metal-semiconductor alloy layer that encroaches laterally and vertically with respect to the aperture.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein:

FIG. 19 to FIG. 25 show a series of schematic cross-sectional diagrams illustrating the results of progressive stages in fabricating a metal-semiconductor alloy layer and a semiconductor device within a semiconductor structure in accordance with still yet another particular embodiment of the invention.

DESCRIPTION OF THE PREFERRED EMBODIMENTS

The invention, which includes particular microelectronic structures that include a metal-semiconductor alloy layer, as well as a method for fabricating the particular microelectronic structures, is understood within the context of the description provided below. The description provided below is understood within the context of the drawings described above. Since the drawings are intended for illustrative purposes, the drawings are not necessarily drawn to scale.

In concert with further disclosure below, while the preferred embodiments illustrate the invention at least primarily within the context of successive stages of fabricating a semiconductor structure, neither the embodiments nor the invention is necessarily intended to be so limited. Rather, the embodiments and the invention contemplate applicability within the context of microelectronic structures other than semiconductor structures (i.e., microelectronic structures containing other than purely electronic microelectronic devices). Such other microelectronic structures may include, but are not necessarily limited to microelectromechanical system EMS) structures (i.e., which contain micromechanical components as well as microelectronic components), as well as optoelectronic structures (i.e., which contain micro optical or micro photo optical components as well as microelectronic components).

Figure 1:
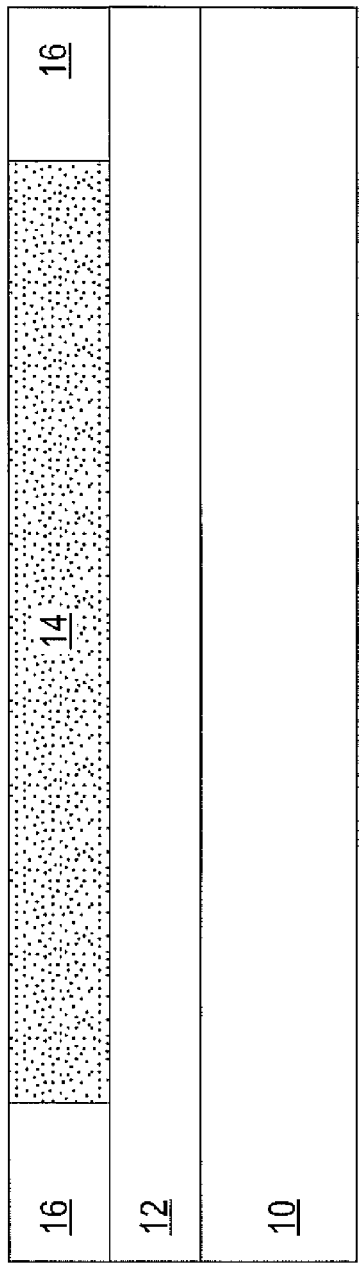
FIG. 1 to FIG. 5 show a series of schematic cross-sectional diagrams illustrating the results of progressive stages in fabricating a metal-semiconductor alloy layer within a semiconductor structure in accordance with a particular embodiment of the invention.

FIG. 1 to FIG. 5 show a series of schematic cross-sectional diagrams illustrating the results of progressive stages in fabricating a metal-semiconductor alloy layer within a semiconductor structure in accordance with a particular embodiment of the invention. This particular embodiment of the invention comprises a first embodiment of the invention. FIG. 1 shows a schematic cross-sectional diagram of the semiconductor structure at an early stage in the fabrication thereof in accordance with this first embodiment.

FIG. 1 shows a base semiconductor substrate 10. A buried dielectric layer 12 is located upon the base semiconductor substrate 10, and a surface semiconductor layer 14 is located upon the buried dielectric layer 12. A plurality of isolation regions 16 is located to cap the end portions of the surface semiconductor layer 14. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a conventional thickness.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material, with crystalline dielectric materials being highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the base semiconductor substrate 10. Typically, the buried dielectric layer 12 has a generally conventional thickness that may be in a range from about 500 to about 3000 angstroms.

The surface semiconductor layer 14 may generally comprise any of the several semiconductor materials from which the base semiconductor substrate 10 may be comprised. However, within the context of the embodiments and the invention, the surface semiconductor layer 14 comprises at least in part a semiconductor material selected from the group including but not limited to silicon, germanium, silicon-germanium alloy, silicon-carbon alloy, germanium-carbon alloy and silicon-germanium-carbon alloy semiconductor materials. When comprising any of the foregoing semiconductor materials, the surface semiconductor layer 14 and the base semiconductor substrate 10 may comprise either identical or different semiconductor materials with respect to chemical composition, dopant polarity, dopant concentration and crystallographic orientation. Typically, the surface semiconductor layer 14 has a generally conventional thickness that may be in a range from about 100 to about 1000 angstroms, although considerable greater thicknesses are not precluded.

The isolation regions 16 may comprise any of several isolation materials that will typically comprise dielectric isolation materials. Typically, the isolation regions 16 comprise a dielectric isolation material selected from the same group of dielectric isolation materials that may be used for the buried dielectric layer 12. However a method used for fabricating the isolation regions 16 may be different from a method used for fabricating the buried dielectric layer 12. Typically, the isolation regions 16 comprise a silicon oxide or a silicon nitride dielectric material, or a composite or laminate thereof. Typically, the isolation regions 16 are formed and planarized to a level the same as the surface semiconductor layer 14.

The semiconductor-on-insulator substrate portion of the semiconductor structure that is illustrated in FIG. 1 may be fabricated using any of several methods Non-limiting examples include lamination methods, layer transfer methods and separation by implantation of oxygen (SIMOX) methods.

Although FIG. 1 illustrates a particular embodiment of the invention within the context of a semiconductor-on-insulator substrate comprising the base semiconductor substrate 10, the buried dielectric layer 12 and the surface semiconductor layer 14, neither the instant embodiment nor the invention is so limited. Rather, the instant embodiment and alternative embodiments may also be practiced under certain circumstances using a bulk semiconductor substrate (that would otherwise result from absence of the buried dielectric layer 12 under circumstances where the base semiconductor substrate 10 and the surface semiconductor layer 14 have identical chemical composition and crystallographic orientation).

Alternatively, the embodiment also contemplates under certain circumstances the use of a hybrid orientation (HOT) substrate. A hybrid orientation substrate has multiple crystallographic orientations within a single semiconductor substrate.

Finally, the embodiment also contemplates the use of ceramic substrates and other dielectric substrates that have located thereupon and laminated thereto a semiconductor layer. Such a "semiconductor layer" is intended as comprising any of the several semiconductor materials from which may be comprised the surface semiconductor layer 14 as disclosed above, including amorphous semiconductor material, polycrystalline semiconductor material and monocrystalline semiconductor material variants thereof.

Figure 2:
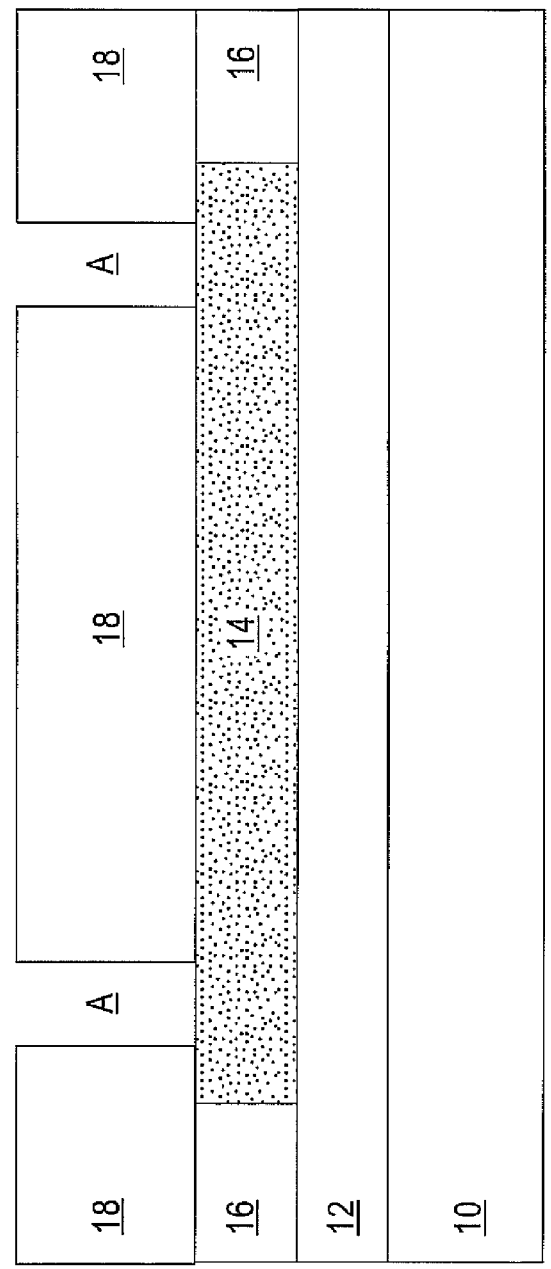

FIG. 2 shows a capping layer 18 located upon the semiconductor structure of FIG. 1 and in particular upon the isolation regions 16 and the surface semiconductor layer 14 within the semiconductor structure of FIG. 1. Located within the capping layer 18 is a plurality of apertures A at the bottoms of which are exposed the surface semiconductor layer 14.

The capping layer 18 comprises a capping material that will typically in-turn comprise a dielectric material. The dielectric material from which may be comprised the capping material may be formed using methods, materials and dimensions generally analogous to standard dielectric layers processed in the back-end of the line (BEOL) or alternatively to the methods, materials and dimensions that are used for forming the buried dielectric layer 12. Typically, the capping layer 18 comprises a silicon oxide material, a silicon nitride material, a silicon oxynitride material, a laminate thereof or a composite thereof. Typically, the capping layer 18 has a thickness from about 50 to about 5000 angstroms.

The apertures A within the capping layer 18 are typically formed using a photolithographic and etch method that is otherwise generally conventional in the semiconductor fabrication art. Typically each of the apertures A has a linewidth from about 0.02 to about 5 microns. Typically, each of the apertures A is separated from an adjacent but separated aperture A by a distance no greater than about 10 times an aperture linewidth (i.e., where the aperture linewidth, as above, is from about 0.02 to about 5 microns). In principle, however, the method in accordance with the instant embodiment may also be extended to larger dimensions of apertures and separation distances.

Figure 3:
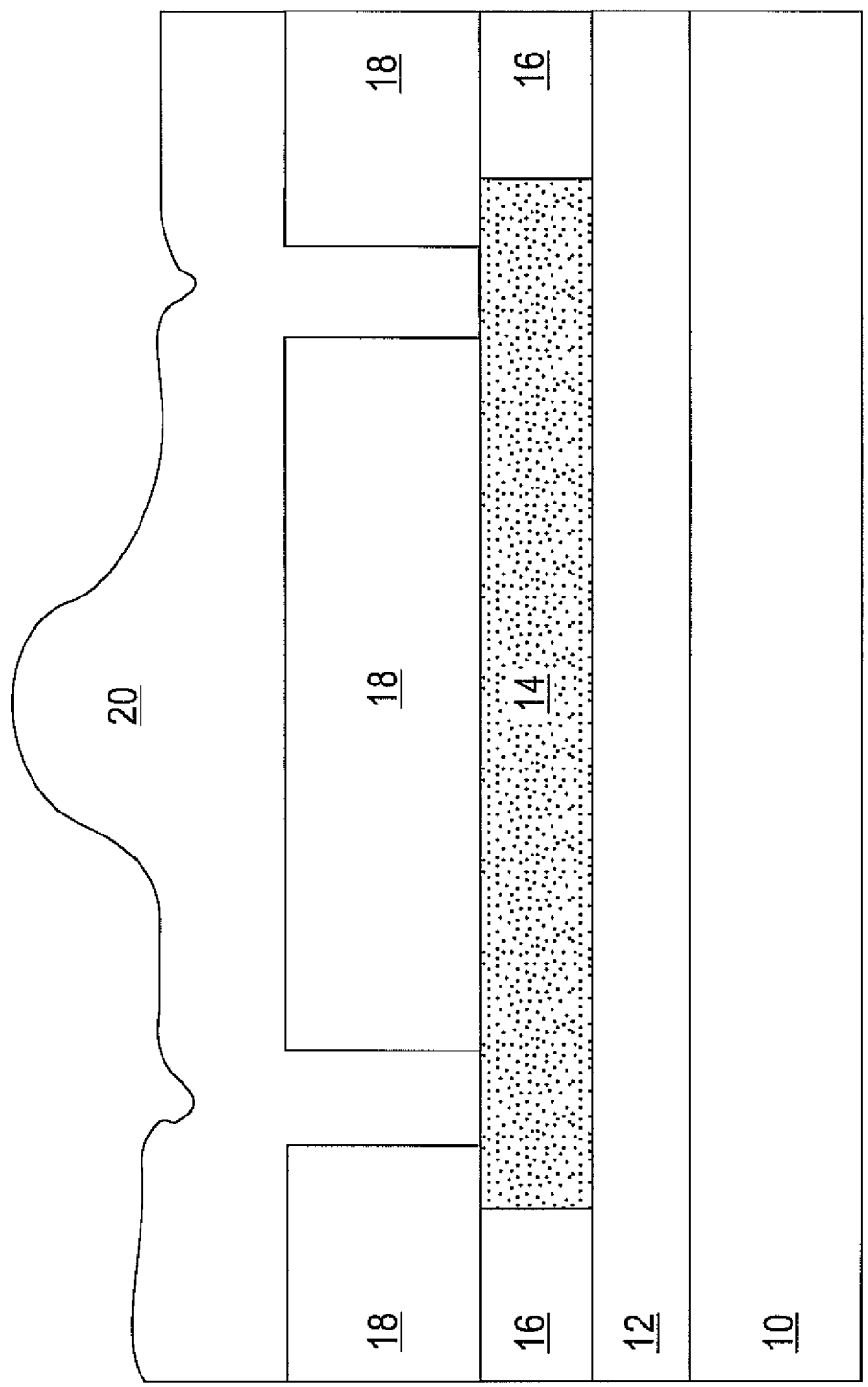

FIG. 3 shows a metal-semiconductor alloy forming metal layer 20 located upon the semiconductor structure of FIG. 2, and in particular filling the apertures A. The metal-semiconductor alloy forming metal layer 20 may comprise any of several metal-semiconductor alloy forming metals. Candidate metal-semiconductor alloy forming metals include as non-limiting examples nickel, cobalt, copper, iron, titanium, tungsten, erbium, ytterbium, platinum and vanadium metal-semiconductor alloy forming metals. Nickel, platinum, cobalt, copper and iron metal-semiconductor alloy forming metals are particularly common in comparison with others of the above enumerated metal-semiconductor alloy forming metals. A particular metal-semiconductor alloy forming metal may be deposited using any of several methods that are conventional in the semiconductor fabrication art. Included in particular are plating methods, chemical vapor deposition methods and physical vapor deposition methods. Typically, the metal-semiconductor alloy forming metal layer 20 has a thickness from about 0.05 micron to about 5 microns, which depends on the dimensions of the apertures A, and which is also intended as considerably thicker than the surface semiconductor layer 14.

Figure 4A:
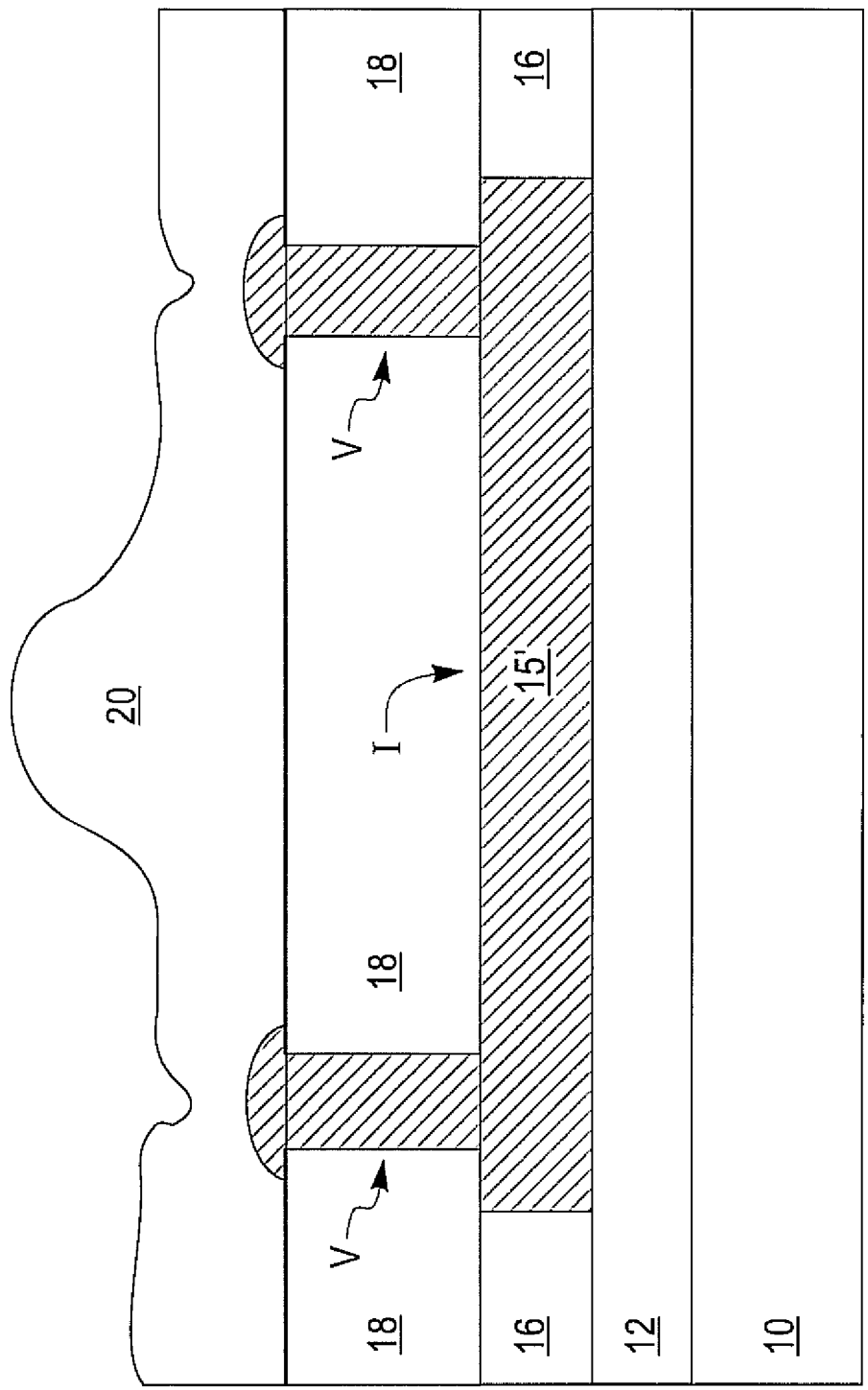

FIG. 4A shows the results of thermally annealing the semiconductor structure of FIG. 3, and in particular the metal-semiconductor alloy forming metal layer 20 in contact with the surface semiconductor layer 14 to form a metal-semiconductor alloy layer 15. As is illustrated within the schematic diagram of FIG. 4A, the metal-semiconductor alloy layer 15 is formed fully encroached (i.e., both vertically and horizontally) in the space where previously was located the surface semiconductor layer 14. As is also illustrated in FIG. 4A, the metal-semiconductor alloy layer 15 includes an interconnect portion I located beneath the capping layer 18 and a plurality of via portions V contiguous with the interconnect portion I at locations where the metal-semiconductor alloy layer 15 has grown through and penetrates the capping layer 18. Although FIG. 4A illustrates the via portions as penetrating the capping layer 18, such is not a requirement of the embodiment. Rather, within the instant embodiment the via portions V at least partially penetrate the capping layer 18, while leaving a pathway that completely penetrates through the capping layer 18.

Within the instant embodiment, the thermal annealing conditions for forming the metal-semiconductor alloy layer 15 are selected so that there is a nominally equivalent diffusion of the metal-semiconductor alloy forming metal 20 into one of the apertures A and a counter-diffusion of a semiconductor material (i.e., from the surface semiconductor layer 14) out of one (i.e., the same one) of the apertures A. Such a nominally equivalent diffusion and counter-diffusion allows the metal-semiconductor alloy layer 15 to be formed without "significant stress," where absence of "significant stress" provides for absence of buckling or delamination of the semiconductor structure whose schematic cross-sectional diagram is illustrated in FIG. 4A. The selection of such a temperature for forming a substantially stress-free metal-semiconductor alloy layer 15 is typically a function of a metal-semiconductor alloy forming metal used for forming the metal-semiconductor alloy layer 15. As a non-limiting example, for a nickel monosilicide (i.e., NiS) metal-semiconductor alloy layer, a desirable thermal annealing temperature for a nickel metal-semiconductor alloy forming metal layer in contact with a silicon surface semiconductor layer will be in a range from about 450 to about 600 degrees centigrade, and more preferably in a range from about 500 to about 550 degrees centigrade.

Figure 4B:
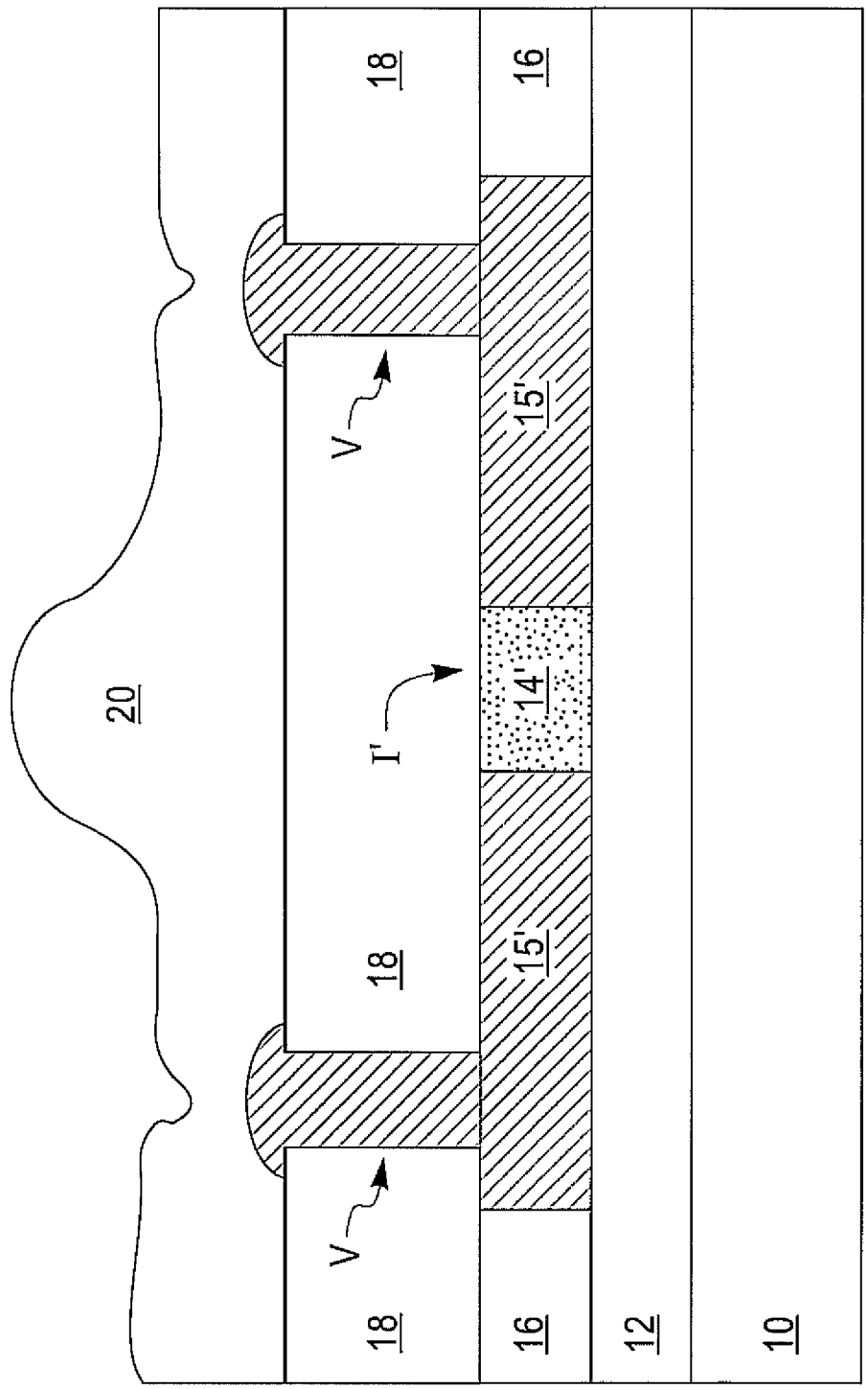

FIG. 4B corresponds with FIG. 4A, but instead shows an incomplete consumption of the surface semiconductor layer 14 to form a plurality of metal-semiconductor alloy layers 15' (which may in fact be contiguous) that are at least in part separated by a surface semiconductor layer 14'. A thermal annealing temperature for forming the semiconductor structure of FIG. 4B from the semiconductor structure of FIG. 3 is otherwise analogous, equivalent or identical to a thermal annealing temperature for forming the semiconductor structure of FIG. 4A from the semiconductor structure of FIG. 3, but a thermal annealing time may vary and be shorter. Alternatively, a separation distance between apertures A that are illustrated in FIG. 2 may be greater.

Figure 5:
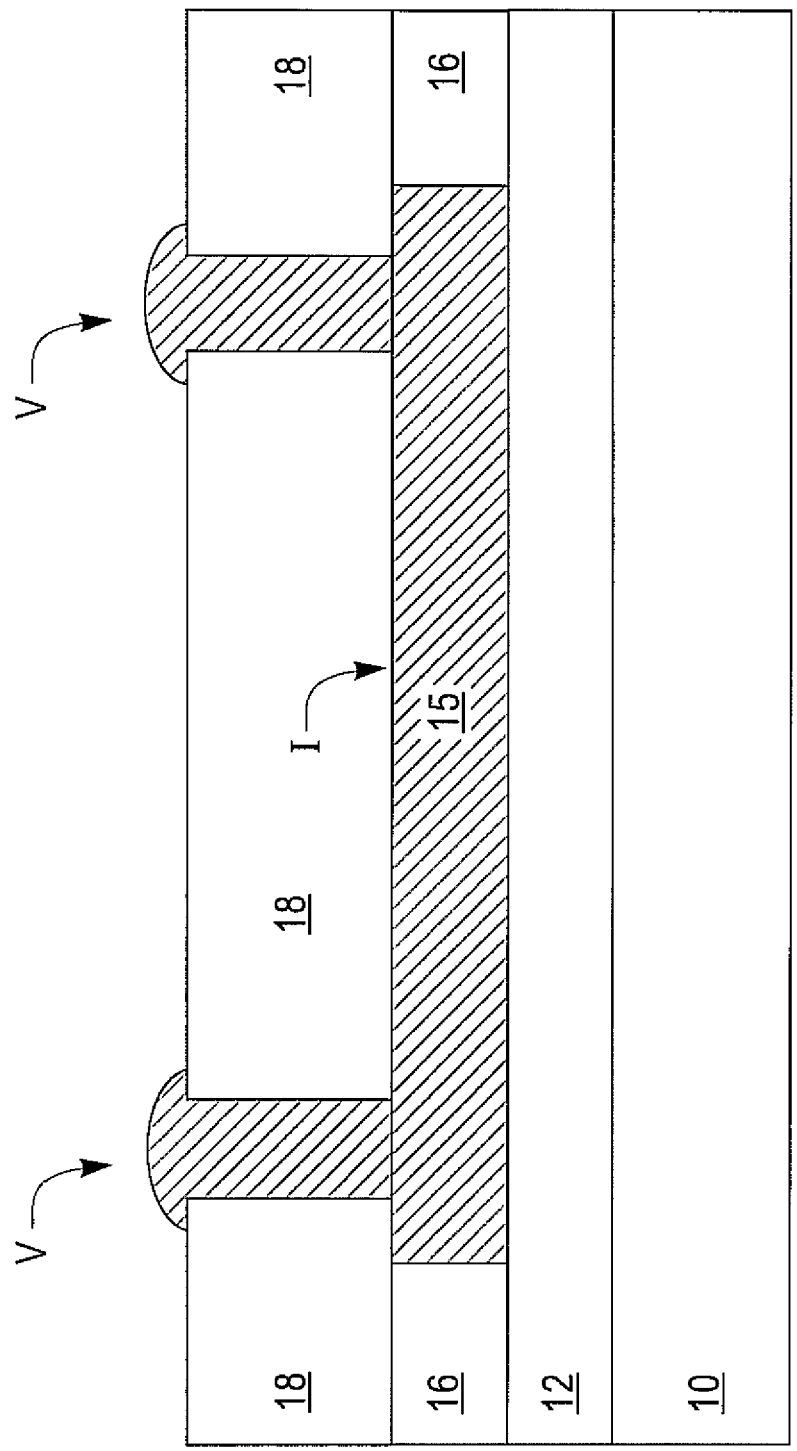

FIG. 5 shows the results of stripping an excess portion of the metal-semiconductor alloy forming metal layer 20 from the semiconductor structure whose schematic cross-sectional diagram is illustrated in FIG. 4A, although identical processing is applicable to the semiconductor structure whose schematic cross-sectional diagram is illustrated in FIG. 4B. The excess portion of the metal-semiconductor alloy forming metal layer 20 may be stripped from the semiconductor structure of FIG. 4A to provide the semiconductor structure of FIG. 5 while using methods and materials that are otherwise generally conventional in the semiconductor fabrication art, and also appropriate for the particular metal-semiconductor alloy forming metal from which is comprised the metal-semiconductor alloy forming metal layer 20. Aqueous acid etch methods are particularly common.

FIG. 5 shows a schematic cross-sectional diagram of a semiconductor structure in accordance with a particular embodiment of the invention that comprises a first embodiment of the invention. The semiconductor structure includes a metal-semiconductor alloy layer 15 in-part interposed between a substrate 10/12 and a capping layer 18. The metal-semiconductor alloy layer 15 includes an interconnect portion I (i.e., located beneath the capping layer 18) contiguous with a plurality of via portions V (i.e., located penetrating at least partially through the capping layer 18). The metal-semiconductor alloy layer 15 may be formed absent significant stress (i.e, as evidenced by absence of bucking or delamination of the semiconductor structure) incident to undertaking a metal-semiconductor alloy formation reaction upon a mostly covered semiconductor material layer (i.e., the surface semiconductor layer 14 as illustrated in FIG. 2) at a temperature that provides for nominally equivalent counter-opposed diffusion and migration of a semiconductor material from the semiconductor material layer and metal-semiconductor alloy forming metal from a metal-semiconductor alloy forming metal layer.

Figure 6:
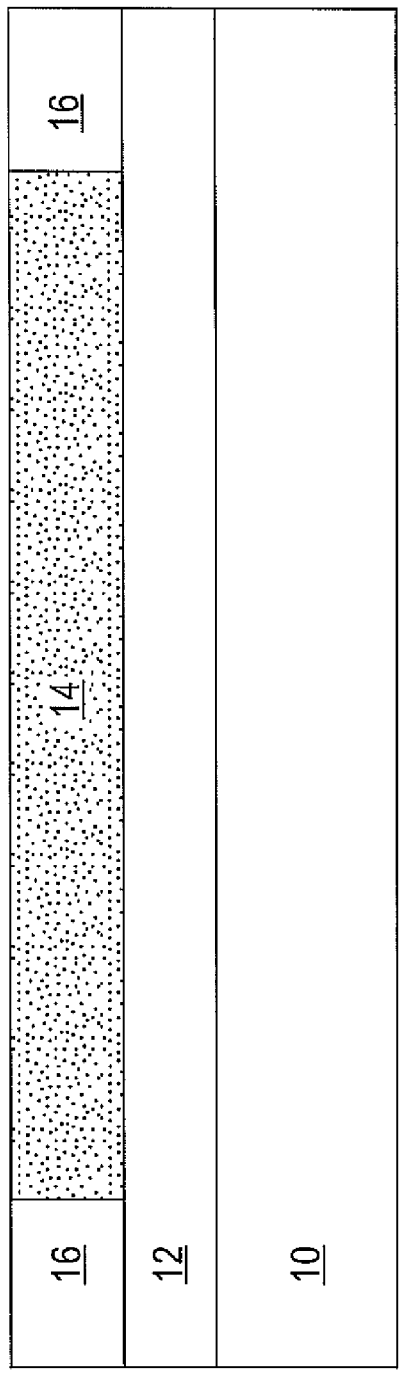
FIG. 6 to FIG. 10 show a series of schematic cross-sectional diagrams illustrating the results of progressive stages in fabricating a metal-semiconductor alloy layer within a semiconductor structure in accordance with another particular embodiment of the invention.

FIG. 6 to FIG. 10 show a series of schematic cross-sectional diagrams illustrating the results of progressive stages in fabricating a semiconductor structure in accordance with another embodiment of the invention. This other embodiment of the invention comprises a second embodiment of the invention. FIG. 6 shows a schematic cross-sectional diagram of the semiconductor structure at an early stage in fabrication thereof in accordance with this second embodiment.

FIG. 6 corresponds analogously, equivalently or identically with FIG. 1. Within FIG. 1 and FIG. 6 like or identical layers and structures are numbered identically.

Figure 7:
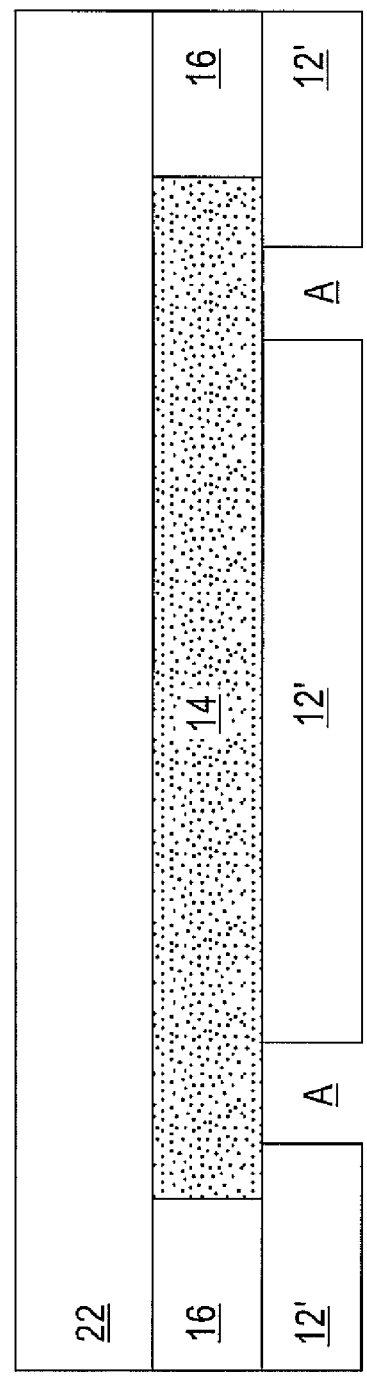

FIG. 7 first shows a carrier substrate 22 laminated to the semiconductor structure of FIG. 6, including in particular the surface semiconductor layer 14 and the isolation regions 16. The carrier substrate 22 may comprise any of several materials, including but not limited to conductor materials, semiconductor materials and dielectric materials. However, under circumstances where the carrier substrate 22 is intended as permanent with respect to the semiconductor structure of FIG. 7, the carrier substrate 22 might more preferably comprise a dielectric material, such as, for example an undoped semiconductor material (i.e. a semiconductor substrate) or an alternative dielectric material (i.e., a ceramic substrate).

The carrier substrate 22 may be laminated using any of several methods that are generally conventional in the semiconductor fabrication art. Pressure based lamination methods and/or thermal based lamination methods are most common lamination methods, but they do not limit the embodiment or the invention.

FIG. 7 next shows the results of delaminating the base semiconductor substrate 10 from the semiconductor structure of FIG. 6. The base semiconductor substrate 10 may under certain circumstances be delaminated by physical cleavage from the buried dielectric layer 12 that is illustrated in FIG. 6.

Alternatively, the base semiconductor substrate 10 may also be ground down to the level of the buried dielectric layer 12 that is illustrated in FIG. 6 by means of mechanical planarization or chemical-mechanical polish planarizing. Chemical-mechanical polish planarizing methods are particularly common.

Finally, FIG. 7 also illustrates a buried dielectric layer 12' that results from patterning of the buried dielectric layer 12. The patterning of the buried dielectric layer 12 to form the buried dielectric layer 12' may be effected using photolithographic and etch methods that are otherwise generally conventional in the semiconductor fabrication art. As is illustrated in FIG. 7, the buried dielectric layer 12' defines a plurality of apertures A which are dimensionally sized and spaced analogously, equivalently or identically to the plurality of apertures A that is illustrated in FIG. 2. Thus, within the context of this embodiment the buried dielectric layer 12' that is illustrated in FIG. 7 serves the purpose of the capping layer 18 that is illustrated in FIG. 2.

As a result of the foregoing process steps, and in accordance with the schematic cross-sectional diagram of FIG. 7, portions of the surface semiconductor layer 14 are exposed within the apertures A at the bottom of the semiconductor structure whose schematic cross-sectional diagram is illustrated in FIG. 7.

Figure 8:
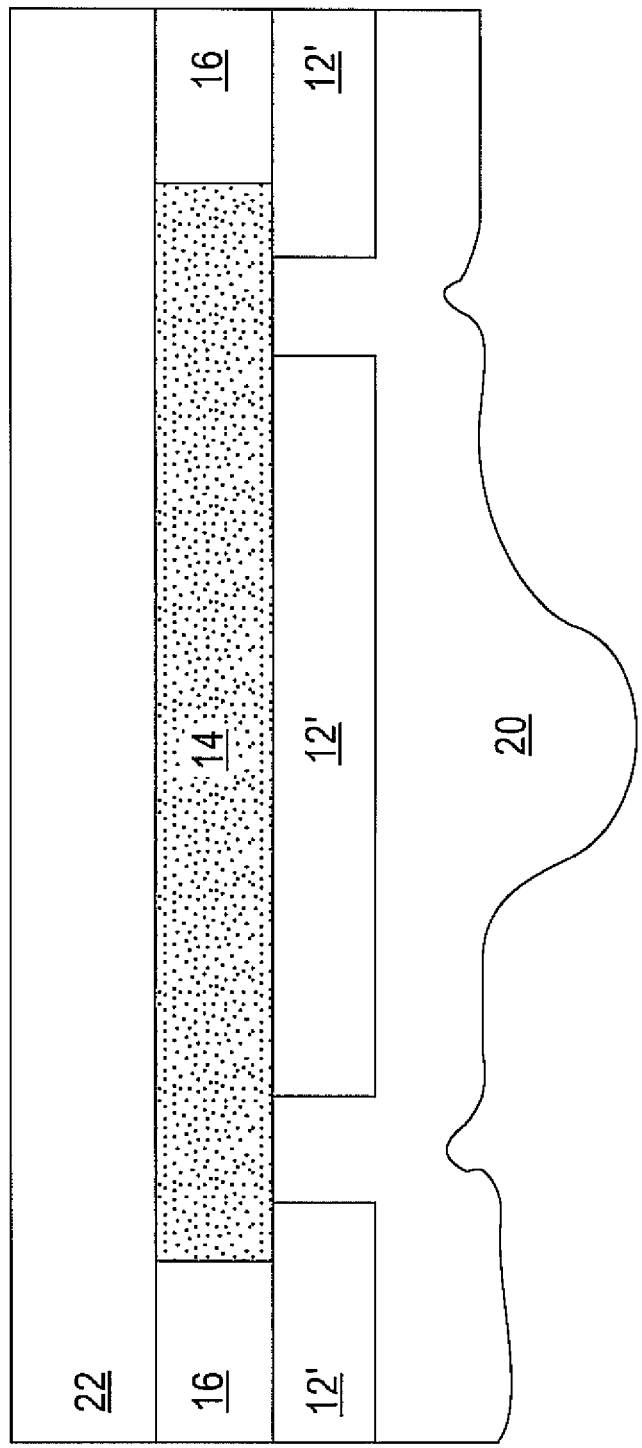

FIG. 8 shows a metal-semiconductor alloy forming metal layer 20 located upon the bottom of the semiconductor structure whose schematic cross-sectional diagram is illustrated in FIG. 7. The metal-semiconductor alloy forming metal layer 20 is otherwise analogous, equivalent or identical to the metal-semiconductor alloy forming metal layer that is illustrated in FIG. 3 but located upon a nominal bottom surface of the semiconductor structure rather than on a nominal top surface of the semiconductor structure.

Figure 9A:
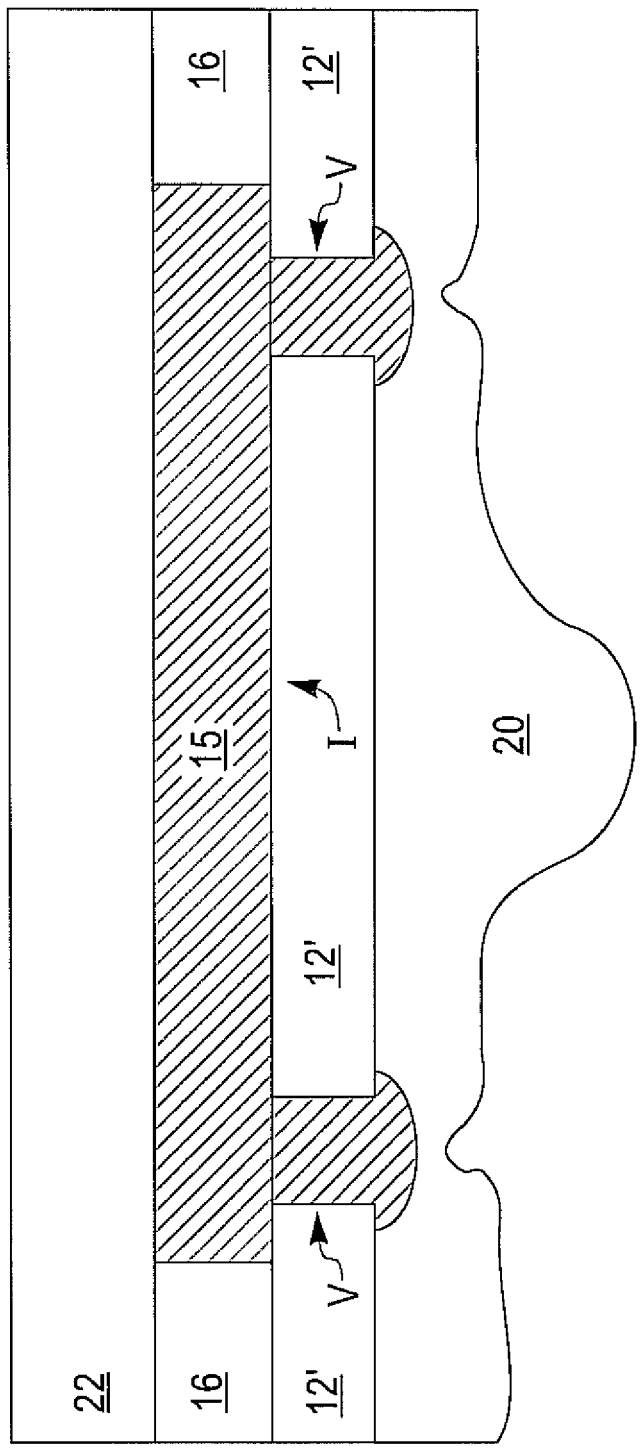

Similarly with FIG. 4A, FIG. 9A also shows a metal-semiconductor alloy layer 15 that results from thermally annealing the surface semiconductor layer 14 and the metal-semiconductor alloy forming metal layer 20. This metal-semiconductor alloy layer 15 also includes an interconnect portion I, as well as a plurality of via portions V contiguous therewith. Analogously with the metal-semiconductor alloy layer 15 that is illustrated in FIG. 4A, the metal-semiconductor alloy layer 15 that is illustrated in FIG. 9A has also completely consumed the semiconductor surface layer 14 that is illustrated in FIG. 8 and fully encroached (i.e., vertically and horizontally) within the space occupied by the surface semiconductor layer 14.

Figure 9B:
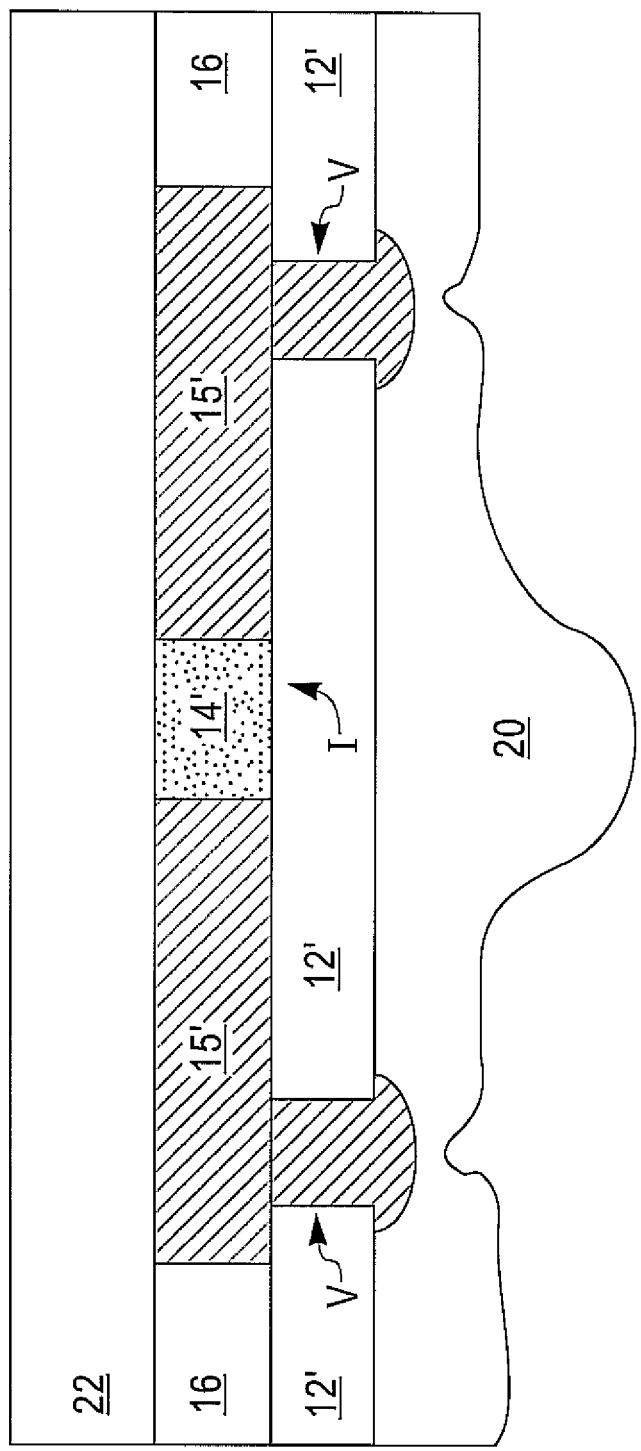

Analogously with FIG. 4B, FIG. 9B illustrates a related option of only partial silicidation (or related reaction) of the surface semiconductor layer 14 to form the metal-semiconductor alloy layers 15' that are separated by the surface semiconductor layer 14'. Thus, within FIG. 4B and FIG. 9B, the interconnect portion I of the metal-semiconductor alloy layer 15' comprises a central portion that comprises a silicon (or related) material rather than a metal-semiconductor alloy material.

Figure 10:
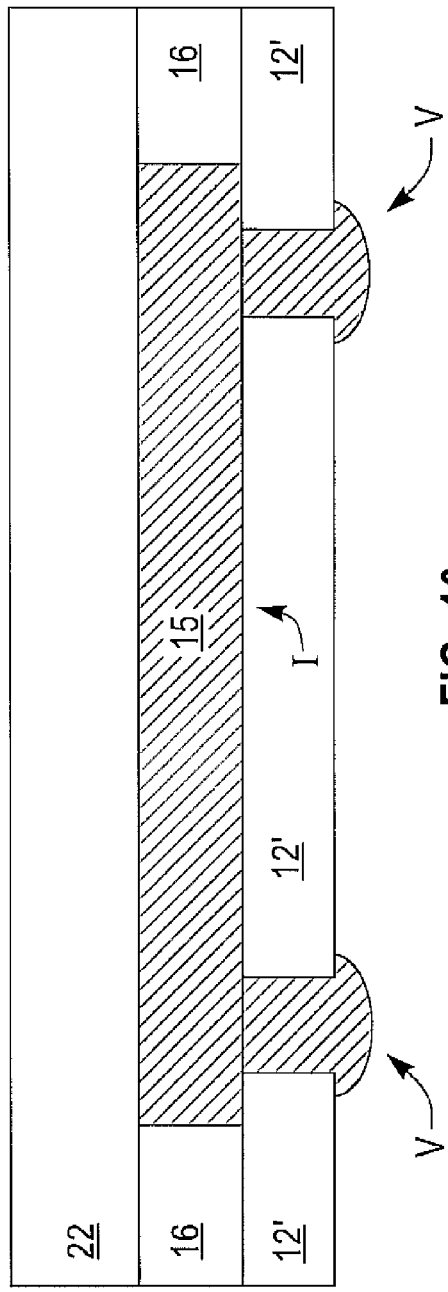

Analogously with FIG. 5, FIG. 10 shows the results of stripping the metal-semiconductor alloy forming metal 20 from the semiconductor structure whose schematic cross-sectional diagram is illustrated in FIG. 9A, although similar processing is also applicable to the semiconductor structure whose schematic cross-sectional diagram is illustrated in FIG. 9B.

FIG. 10 shows a schematic cross-sectional diagram of a semiconductor structure in accordance with a second embodiment of the invention.

The semiconductor structure of FIG. 10 is analogous with the semiconductor structure of FIG. 5 insofar as each of the semiconductor structures includes a metal-semiconductor alloy layer 15 that includes an interconnect portion I and a contiguous via portion V. However, within this second embodiment, the via portions V of the metal-semiconductor alloy layer 15 point down from the contiguous interconnect portion I of the metal-semiconductor alloy layer 15 within the context of a reference plane that includes a base semiconductor substrate 10 that remains in the semiconductor structure of FIG. 5 but is removed in the semiconductor structure of FIG. 10.

FIG. 11 to FIG. 18 show a series of schematic cross-sectional diagrams illustrating the results of progressive stages in fabricating a semiconductor structure in accordance with yet another embodiment of the invention. This particular other embodiment of the invention comprises a third embodiment of the invention.

Figure 11:
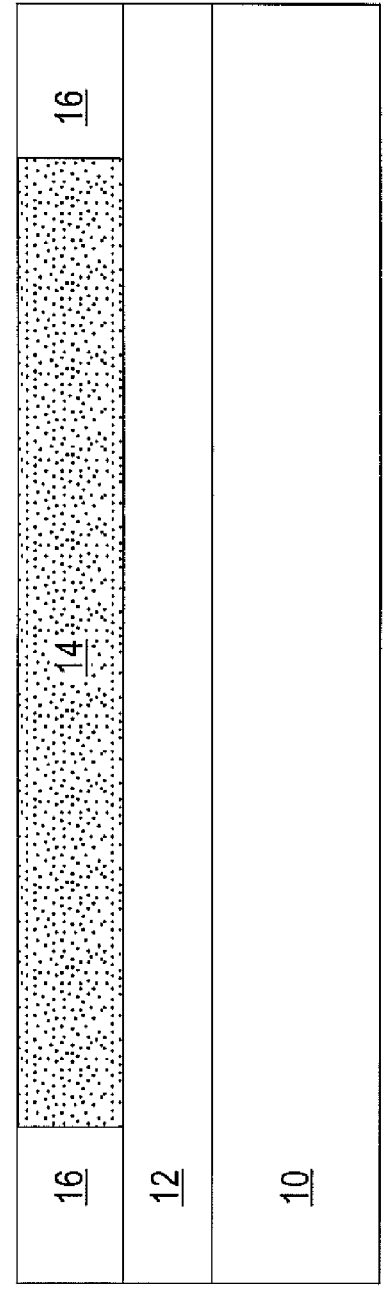
FIG. 11 to FIG. 18 show a series of schematic cross-sectional diagrams illustrating the results of progressive stages in fabricating a metal-semiconductor alloy layer and a semiconductor device within a semiconductor structure in accordance with yet another particular embodiment of the invention.

FIG. 11 corresponds analogously, equivalently or identically with FIG. 1 and FIG. 6. Like layers and structures within FIG. 1, FIG. 6 and FIG. 11 are numbered identically.

Figure 12:
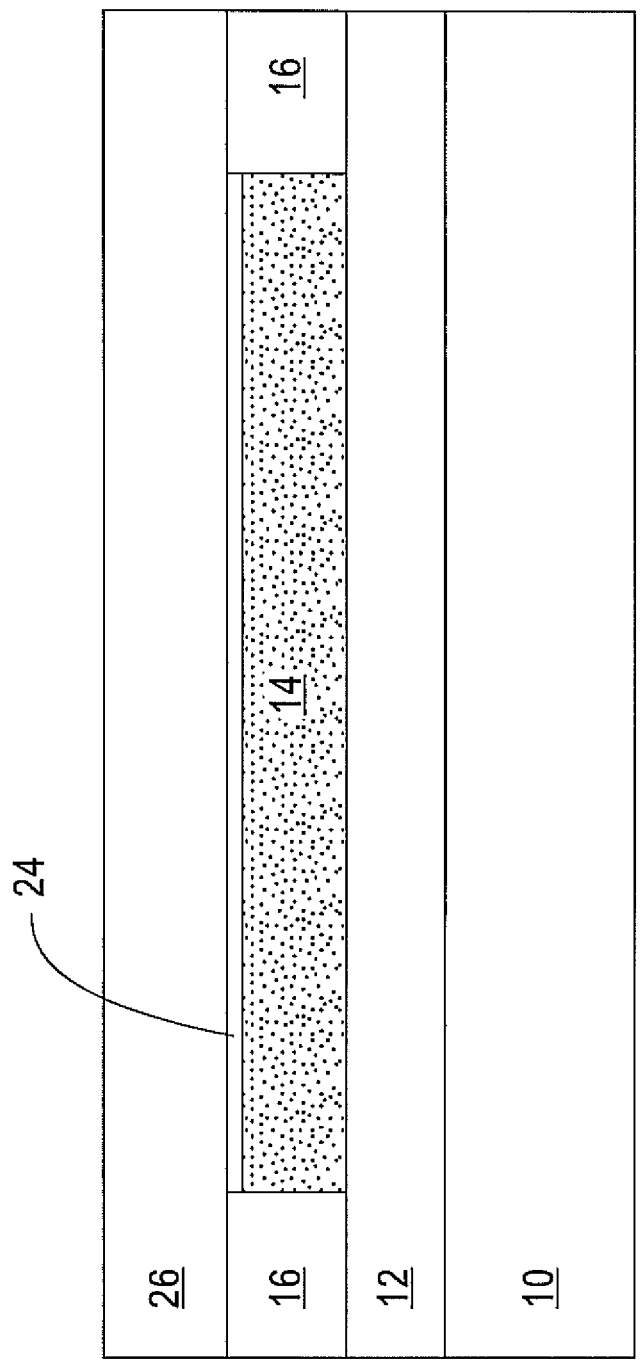

FIG. 12 shows a second capping layer 24 located upon the surface semiconductor layer 14. FIG. 12 also shows a second surface semiconductor layer 26 located upon the isolation regions 16 and the second capping layer 24.

The second capping layer 24 may comprise any of several dielectric materials, and in general may comprise a dielectric material selected from the same group of dielectric materials from which is comprised the isolation regions 16.

Alternatively, the second capping layer 24 may also comprise a gate dielectric material. Such a gate dielectric material may comprise conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, such a gate dielectric material may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The second capping layer 24, whether intended as comprising a gate dielectric material or a dielectric material other than a gate dielectric material, may be formed using any of several methods that are appropriate to its material of composition. Non limiting examples include thermal or plasma oxidation or nitridation methods, chemical vapor deposition methods (including atomic layer deposition methods) and physical vapor deposition methods. Typically, the second capping layer 24 when intended as comprising a gate dielectric material comprises a thermal silicon oxide dielectric material that has a thickness from about 5 to about 50 angstroms.

The second surface semiconductor layer 26 may comprise the same or different semiconductor materials in comparison with the surface semiconductor layer 14, with respect to dopant polarity, dopant concentration and crystallographic orientation. In particular, the second surface semiconductor layer 26 need not necessarily comprise a silicon semiconductor material. The second surface semiconductor layer 26 may have a thickness similar to the thickness of the surface semiconductor layer 14, but such a similar thickness is not a limitation of the embodiment.

Figure 13:
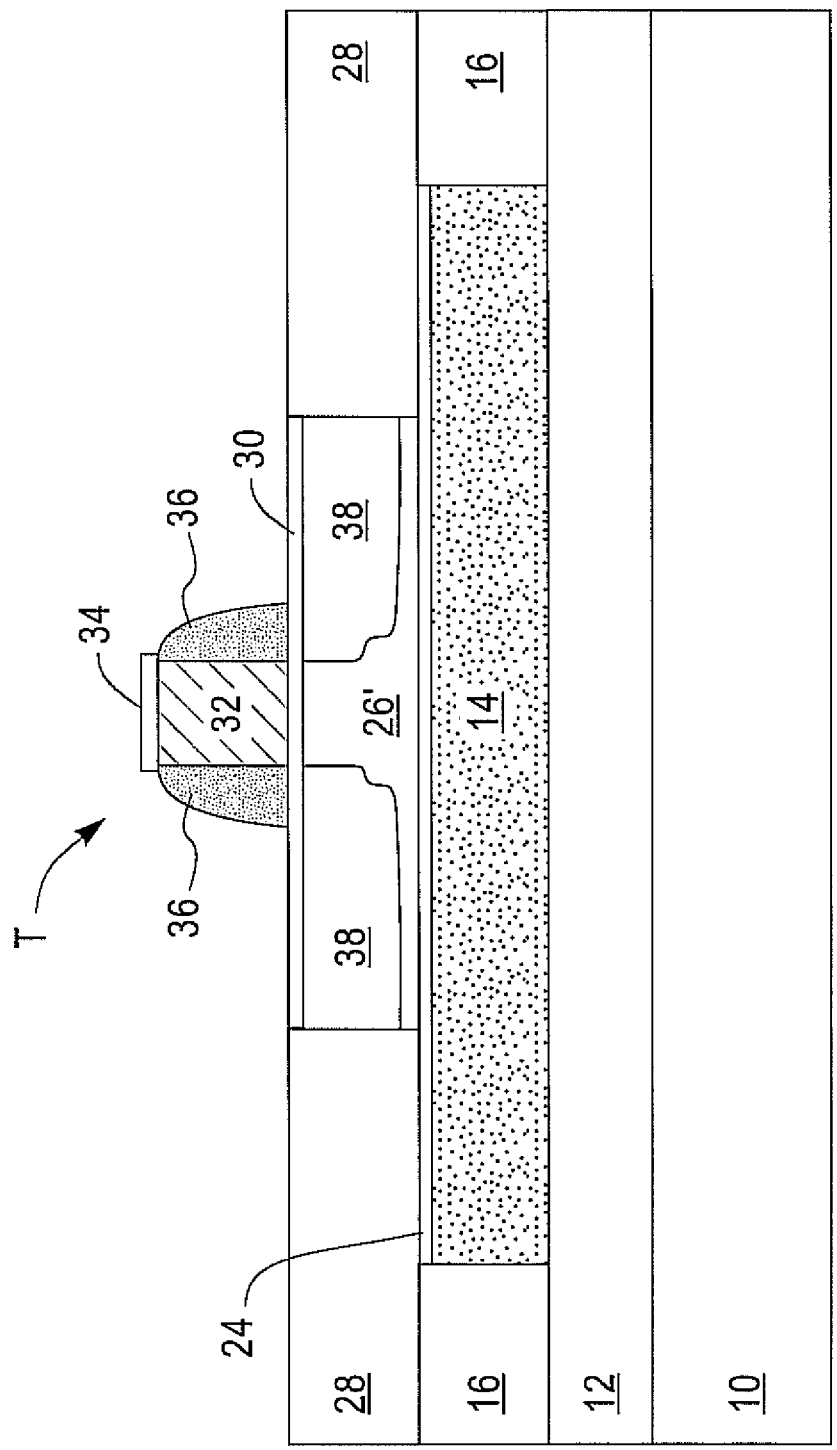

FIG. 13 first shows the results of patterning the second surface semiconductor layer 26 to form a second surface semiconductor layer 26'. FIG. 13 also shows a plurality of second isolation regions 28 that is located and formed backfilling removed areas of the second surface semiconductor layer 26 when forming the second surface semiconductor layer 26'.

The second surface semiconductor layer 26 may be patterned to form the second surface semiconductor layer 26' while using methods and materials that are otherwise generally conventional in the semiconductor fabrication art. Included in particular are wet chemical etch methods, dry plasma etch methods and aggregate etch methods thereof that are generally intended to provide straight sidewalls to the second surface semiconductor layer 26'.

Similarly, the second isolation regions 28 may be formed using a blanket layer deposition and subsequent planarization method that may be analogous, equivalent or identical to the related methods that are used for forming the isolation regions 16.

FIG. 13 finally shows a transistor T (i.e., a semiconductor device that includes an active doped region, in particular a source/drain region 38) that is located while using the second surface semiconductor layer 26' in-part as a channel region. The transistor T includes a gate dielectric 30 located upon the second surface semiconductor layer 26', a gate electrode 32 located upon the gate dielectric 30, a capping layer 34 located upon the gate electrode 32, a spacer 36 (i.e., a plurality in cross-section but intended as a single spacer 36 in plan-view) located encircling sidewalls of at least the gate electrode 32; and a plurality of source/drain regions 38 located within the second surface semiconductor layer 26' and separated by the gate electrode 32. Each of the foregoing layers and structures from which is comprised the transistor T may in-turn comprise materials, have dimensions and be formed using methods that are generally conventional in the semiconductor fabrication art.

Similarly with the second capping layer 24, the gate dielectric 30 may comprise conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the gate dielectric 30 may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The gate dielectric 30 may be formed using any of several methods that are appropriate to its material of composition. Non limiting examples include thermal or plasma oxidation or nitridation methods, chemical vapor deposition methods (including atomic layer deposition methods) and physical vapor deposition methods. Typically, the gate dielectric 30 comprises a thermal silicon oxide or thermal silicon oxynitride dielectric material that has a thickness from about 5 to about 30 angstroms.

The gate electrode 32 may comprise materials including but not limited to certain metals, metal alloys, metal nitrides and metal metal-semiconductor alloys, as well as laminates thereof and composites thereof. The gate electrode 32 may also comprise doped polysilicon and polysilicon-germanium alloy materials (i.e., having a dopant concentration from about 1e18 to about 1e22 dopant atoms per cubic centimeter) and polycide materials (doped polysilicon/metal metal-semiconductor alloy stack materials), Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 32 comprises a doped polysilicon material that has a thickness from about 200 to about 1000 angstroms.

The capping layer 34 comprises a capping material that in turn typically comprises a hard mask material. Dielectric hard mask materials are most common but by no means limit the instant embodiment or the invention. Non-limiting examples of hard mask materials include oxides, nitrides and oxynitrides of silicon. Oxides, nitrides and oxynitrides of other elements are not excluded. The capping material may be formed using any of several methods that are conventional in the semiconductor fabrication art. Non-limiting examples include chemical vapor deposition methods and physical vapor deposition methods. Typically, the capping layer 34 comprises a silicon nitride capping material that has a generally conventional thickness that may be in a range from about 100 to about 500 angstroms.

The spacer 36 typically comprises a dielectric spacer material. Similarly with other dielectric structures within the instant embodiment, candidate dielectric spacer materials again include oxides, nitrides and oxynitrides of silicon. Also again, oxides, nitrides and oxynitrides of other elements are not excluded. The spacer 36 is formed using a blanket layer deposition and anisotropic etchback method that uses an anisotropic etching plasma for etching purposes. Under certain circumstances, the spacer 36 may comprise a different dielectric material than the capping layer 34 to allow for selective removal of the capping layer 34.

The source/drain regions 38 comprise a dopant of polarity appropriate for the polarity of the transistor T. As is conventional in the art, the source/drain regions 38 are formed using a generally conventional two-step ion implantation method that uses the gate electrode 32, with and without the spacer 36, as a mask. Conventional dopant concentrations may be used within each step of the two-step method.

Figure 14:
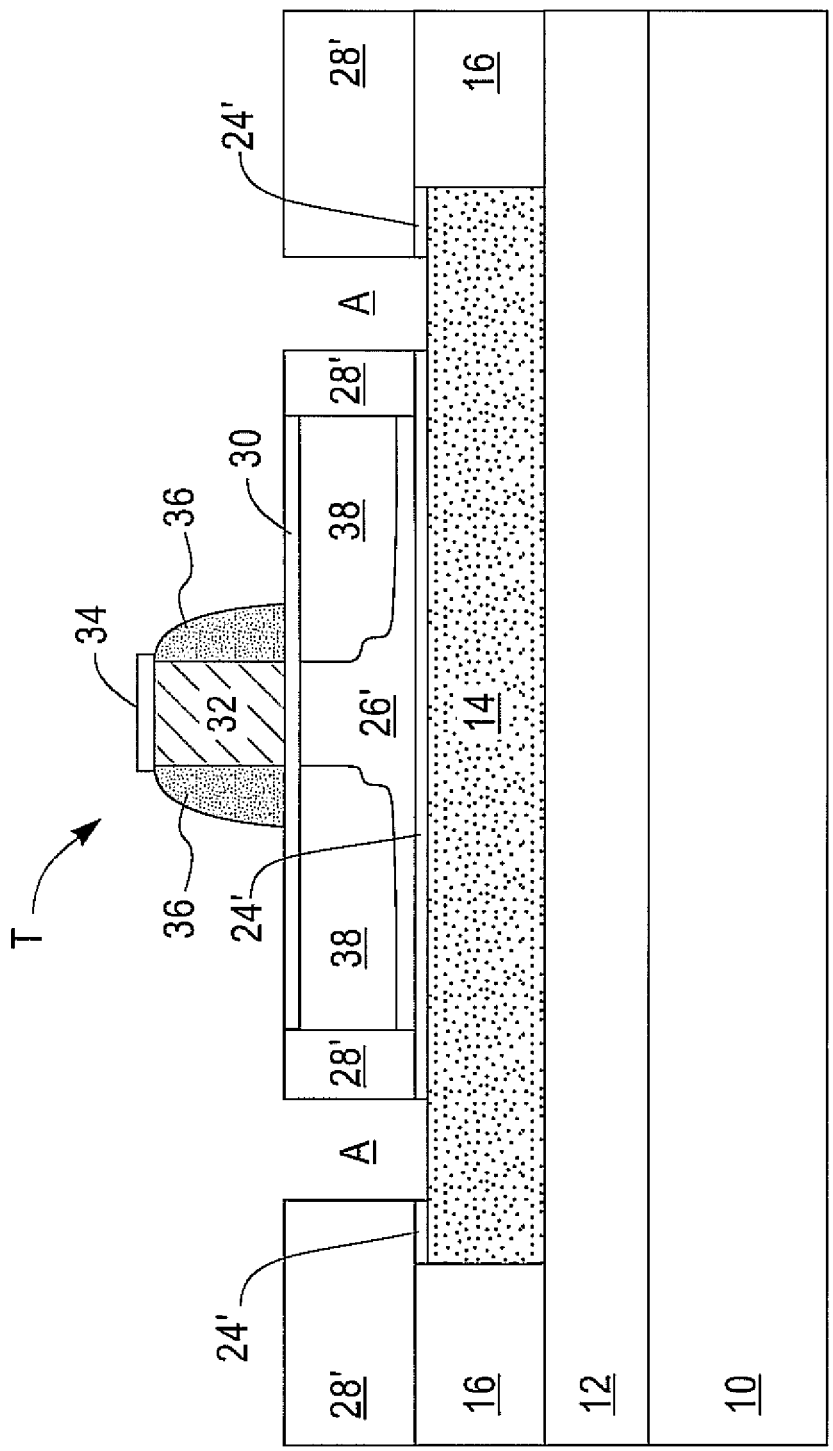

FIG. 14 shows a plurality of isolation regions 28' that results from patterning the isolation regions 28. The isolation regions 28' may be patterned to form the isolation regions 28 while also using photolithographic and etch methods that are conventional in the semiconductor fabrication art. As is illustrated within FIG. 14, and similarly with the first embodiment and second embodiment of the invention, the isolation regions 28' define a plurality of apertures A that expose the surface semiconductor layer 14. The plurality of apertures A is otherwise analogous, equivalent or identical (with respect to dimensions and separation distances) in comparison with the apertures A that are illustrated in FIG. 2 and FIG. 7.

Figure 15:
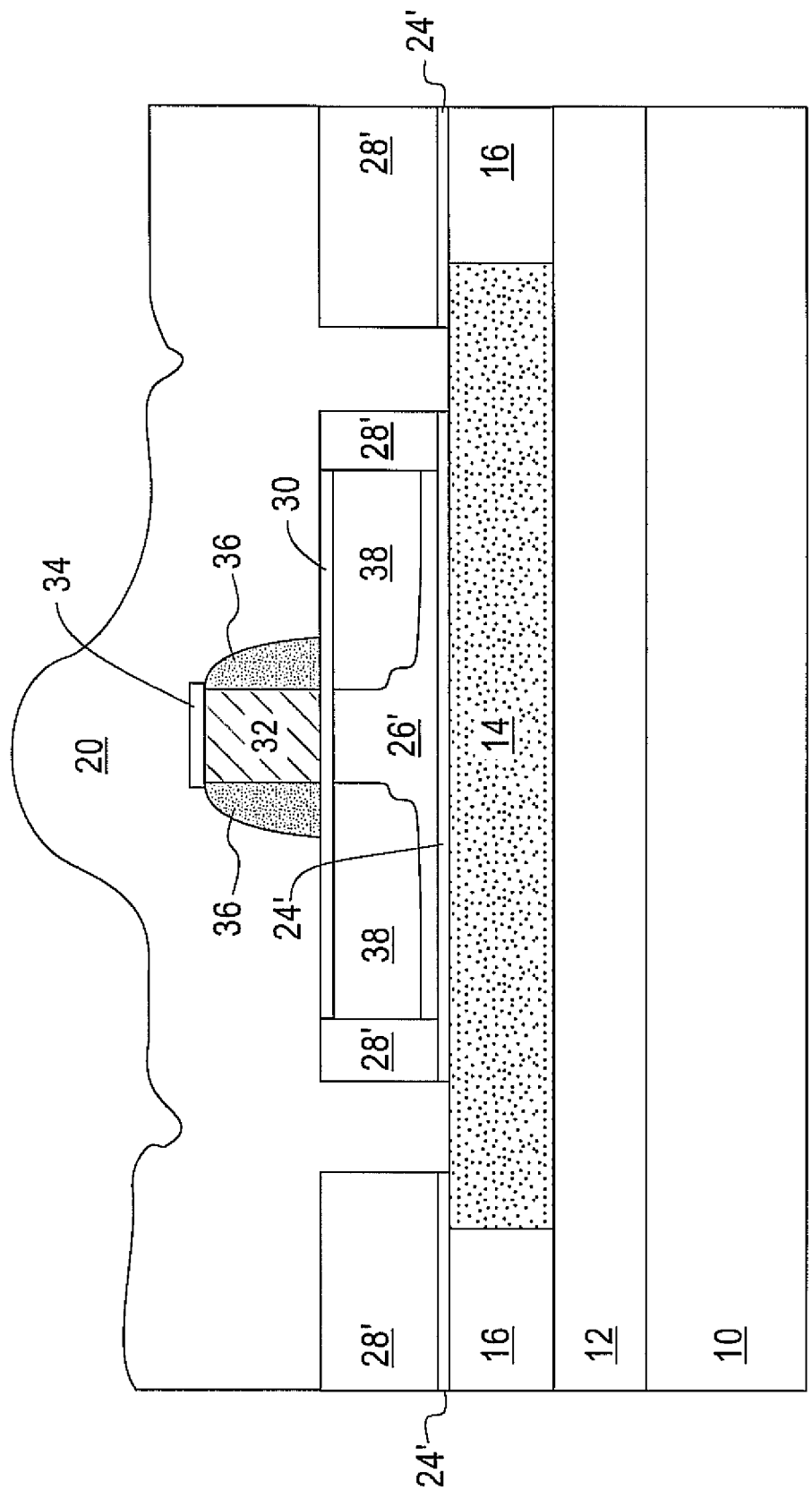

FIG. 15 shows a metal-semiconductor alloy forming metal layer 20 located upon the semiconductor structure of FIG. 14. The metal-semiconductor alloy forming metal layer 20 corresponds analogously, equivalently or identically with the metal-semiconductor alloy forming metal layer 20 that is described in greater detail above within the context of FIG. 3 and FIG. 8.

Figure 16:
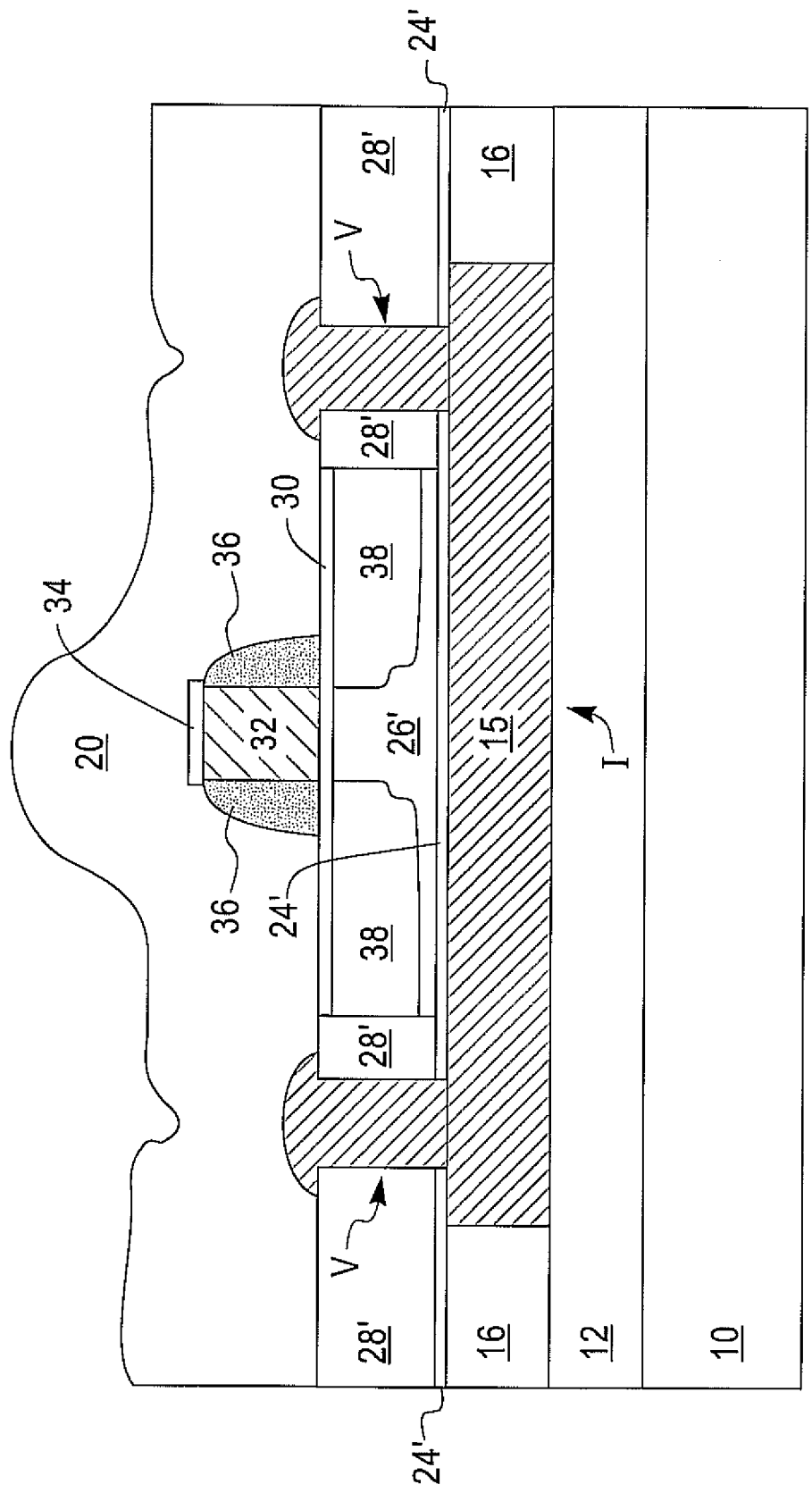

FIG. 16 shows a metal-semiconductor alloy layer 15 that is formed by thermally annealing and reacting the surface semiconductor layer 14 with the metal-semiconductor alloy forming metal layer 20 that is illustrated in FIG. 15. Particular characteristics of the reaction of the surface semiconductor layer 14 and the metal-semiconductor alloy forming metal layer 20 are discussed in greater detail above within the context of FIG. 4A and FIG. 9A, or for only a partial reaction of the surface semiconductor layer 14 and the metal-semiconductor alloy forming metal layer 20 within the context of FIG. 4B and FIG. 9B.

Figure 17:
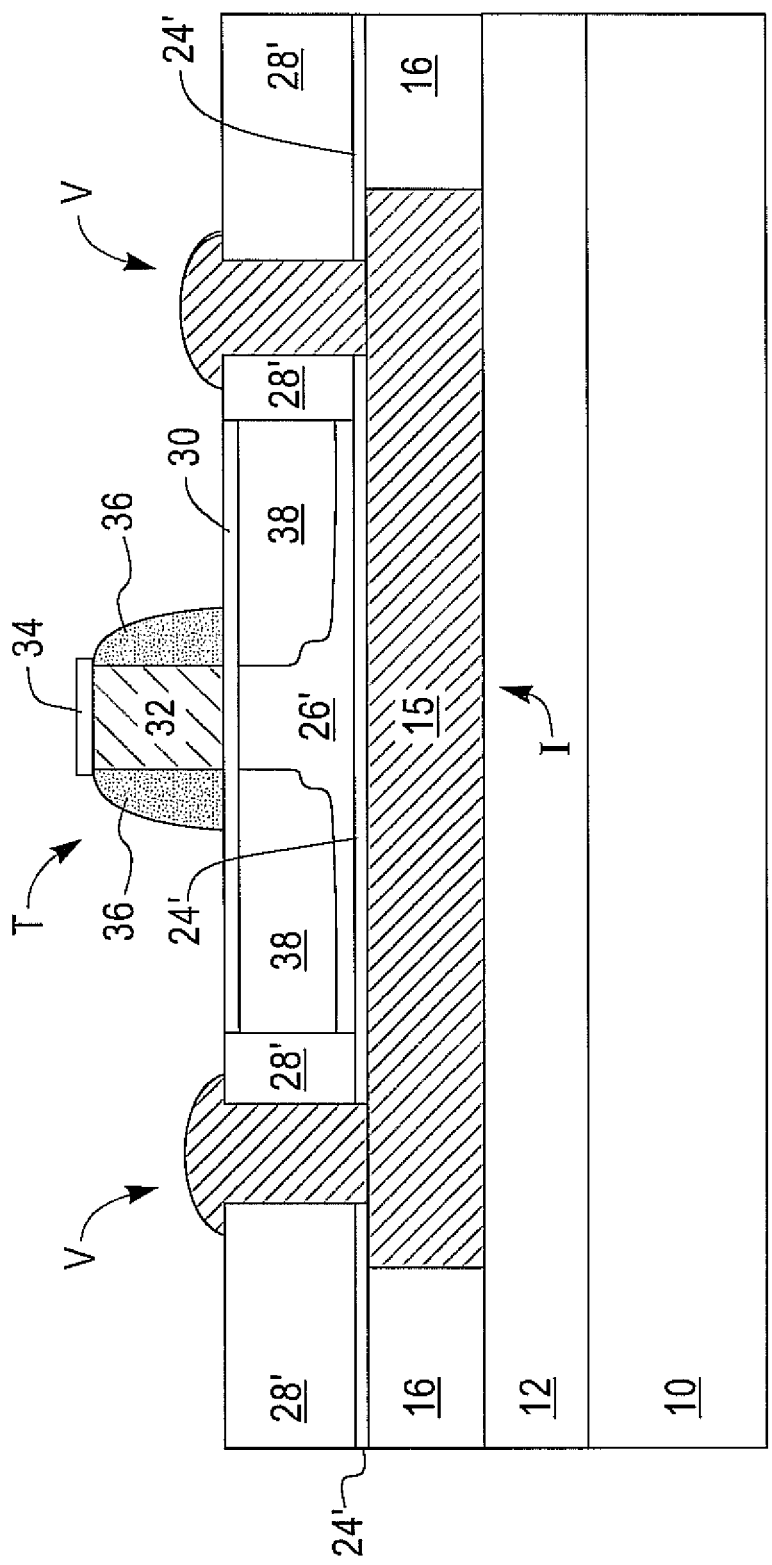

FIG. 17 shows the results of stripping unreacted portions of the metal-semiconductor alloy forming metal layer 20 from the semiconductor structure of FIG. 16. The unreacted portions of the metal-semiconductor alloy forming metal layer 20 may be stripped while using etch methods, and in particular acid etch methods, that are disclosed in greater detail above.

Figure 18:
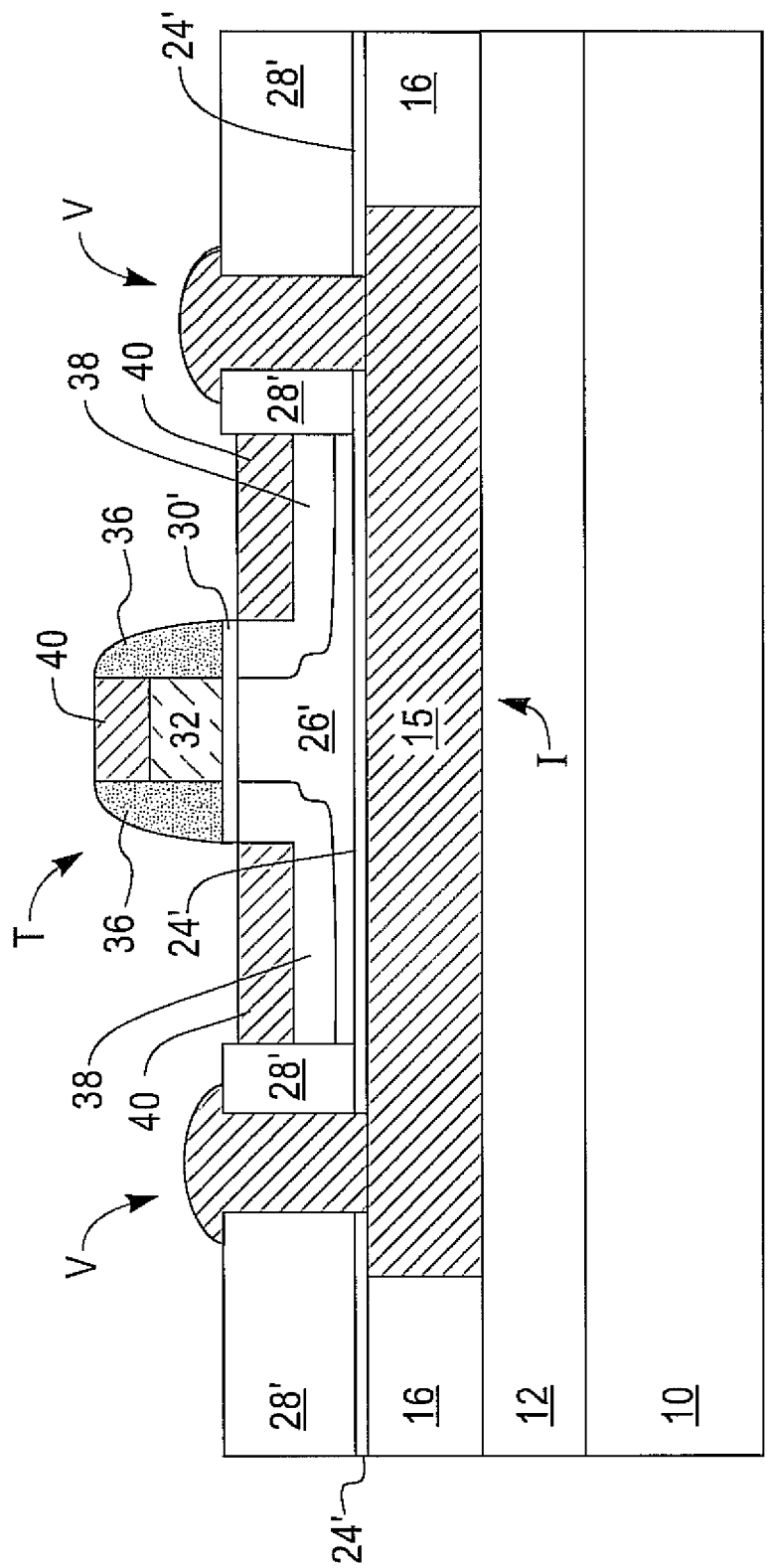

FIG. 18 first shows the results of stripping the capping layer 34, as well as portions of the gate dielectric layer 30, from the semiconductor structure of FIG. 17. As a result, a gate dielectric 30' is formed from the gate dielectric 30. The capping layer 34 and portions of the gate dielectric 30 may be stripped using methods and materials that are otherwise generally conventional in the semiconductor fabrication art. In particular, hydrofluoric acid etchants are common for stripping silicon oxide materials while phosphoric acid etchants are common for stripping silicon nitride materials. Plasma etch methods are not excluded.

FIG. 18 finally shows the results of forming a plurality of second metal-semiconductor alloy layers 40 upon exposed surfaces of the source/drain regions 38 and the gate electrode 32. The second metal-semiconductor alloy layers 40 may be formed using the same group of metal-semiconductor alloy forming metals that are used for forming the metal-semiconductor alloy layer 15, however, the metal-semiconductor alloy layer 15 and the second metal-semiconductor alloy layers 40 typically do not necessarily comprise the same metal-semiconductor alloy material.

FIG. 18 shows a schematic cross-sectional diagram of a semiconductor structure in accordance with a third embodiment of the invention. Beyond the particular dimensional and geometric characteristics of a metal-semiconductor alloy layer 15 disclosed above with respect to the first embodiment and the second embodiment, the metal-semiconductor alloy layer 15 within the third embodiment is located interposed between a substrate 10/12 and a semiconductor device T that has an active doped junction (i.e., a source/drain region 38). Within the context of this third embodiment, since the metal-semiconductor alloy layer 15 is formed after the active doped junction within the semiconductor device T, the active doped junction may be activated using an elevated thermal activation temperature from about 800 to about 1100 degrees centigrade, absent any thermally induced damage to the metal-semiconductor alloy layer 15 that has not yet been formed.

FIG. 19 to FIG. 25 show a series of schematic cross-sectional diagrams illustrating the results of progressive stages in fabricating a semiconductor structure in accordance with still yet another embodiment of the invention. This particular embodiment comprises a fourth embodiment of the invention.

FIG. 19 and FIG. 20 correspond analogously, equivalently or identically with FIG. 11 and FIG. 12. Like structures and layers within the foregoing structures are numbered identically.

Figure 21:
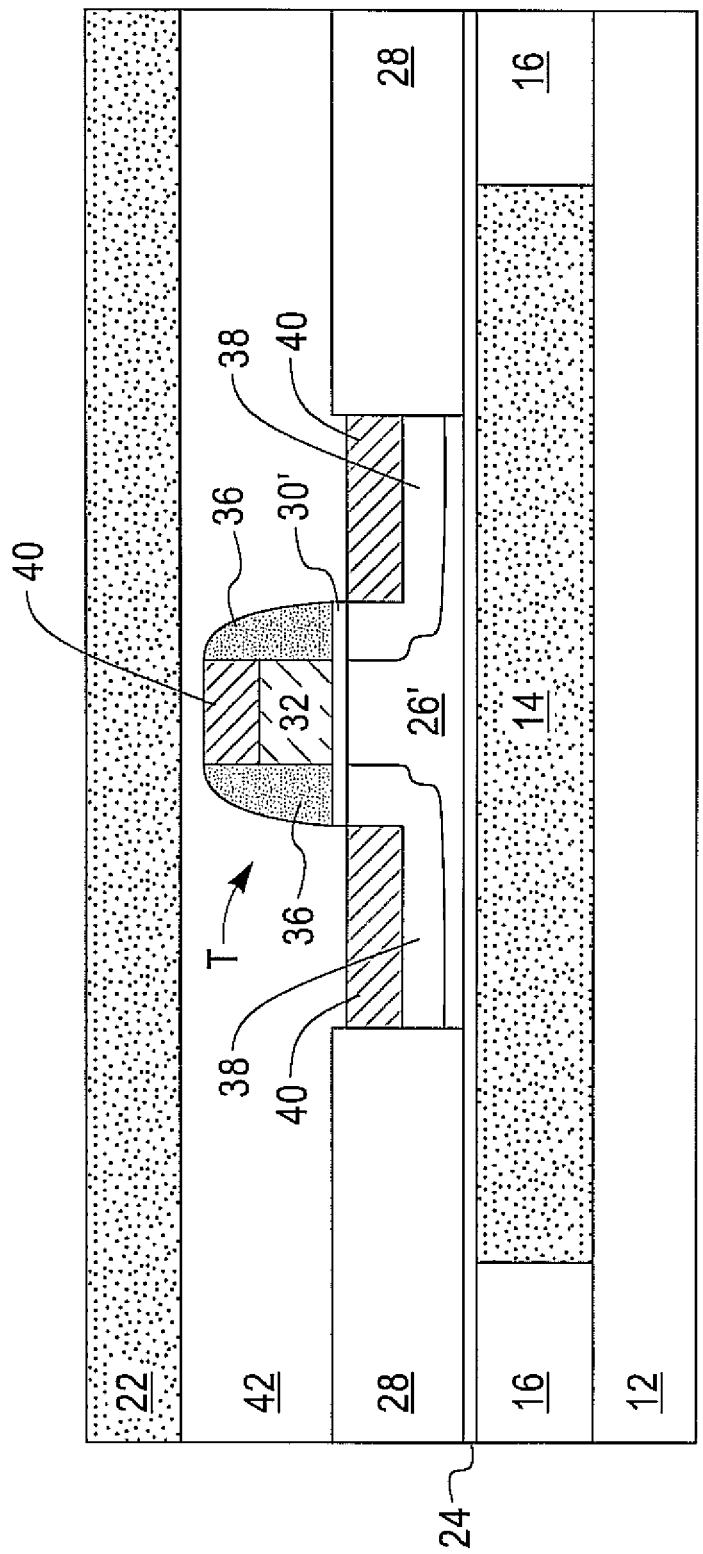

FIG. 21 first shows the results of patterning the second surface semiconductor layer 26 to form a second surface semiconductor layer 26'. FIG. 21 than shows the results of forming a transistor T within and upon the second surface semiconductor layer 26'. The layers and structures that comprise the transistor T are analogous, equivalent or identical to the layers and structures that comprise the transistor T that is illustrated in FIG. 13. Subsequent to forming the transistor T, the transistor T is capped with an inter-level dielectric (ILD) layer 42 to which in turn is laminated the carrier substrate 22.

The carrier substrate 22 is described in further detail above within the context of the second embodiment as described in FIG. 8. The inter-level dielectric layer 42 typically comprises an inter-level dielectric material. Silicon oxide, silicon nitride and silicon oxynitride inter-level dielectric materials are common. Generally, the inter-level dielectric layer 42 may comprise materials, have dimensions and be formed using methods analogous, equivalent or identical to the materials, dimensions and methods used for forming the buried dielectric layer 12.

Figure 22:
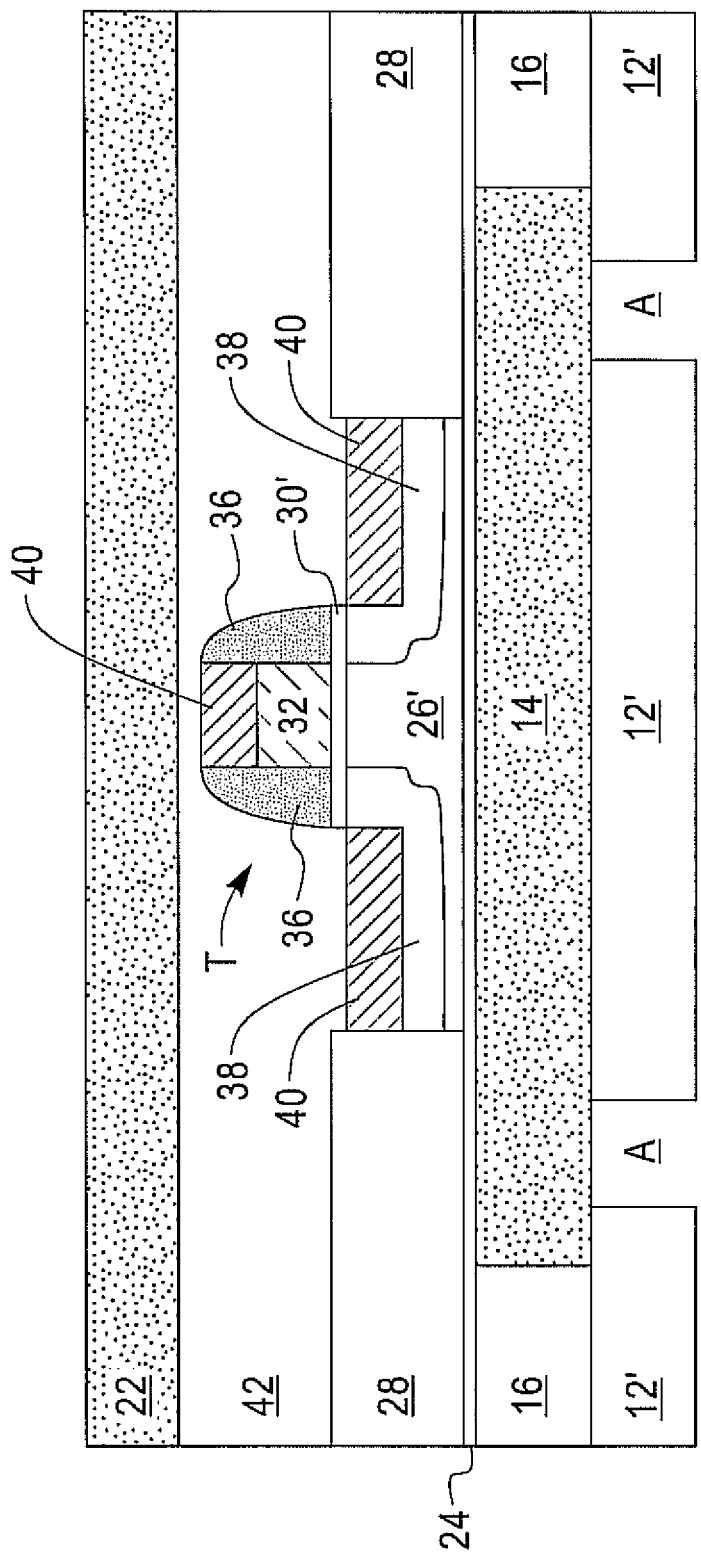

FIG. 22 shows the results of patterning the buried dielectric layer 12 to form a buried dielectric layer 12'. This particular processing corresponds with the processing that is illustrated in FIG. 14 within the third embodiment.

Figure 23:
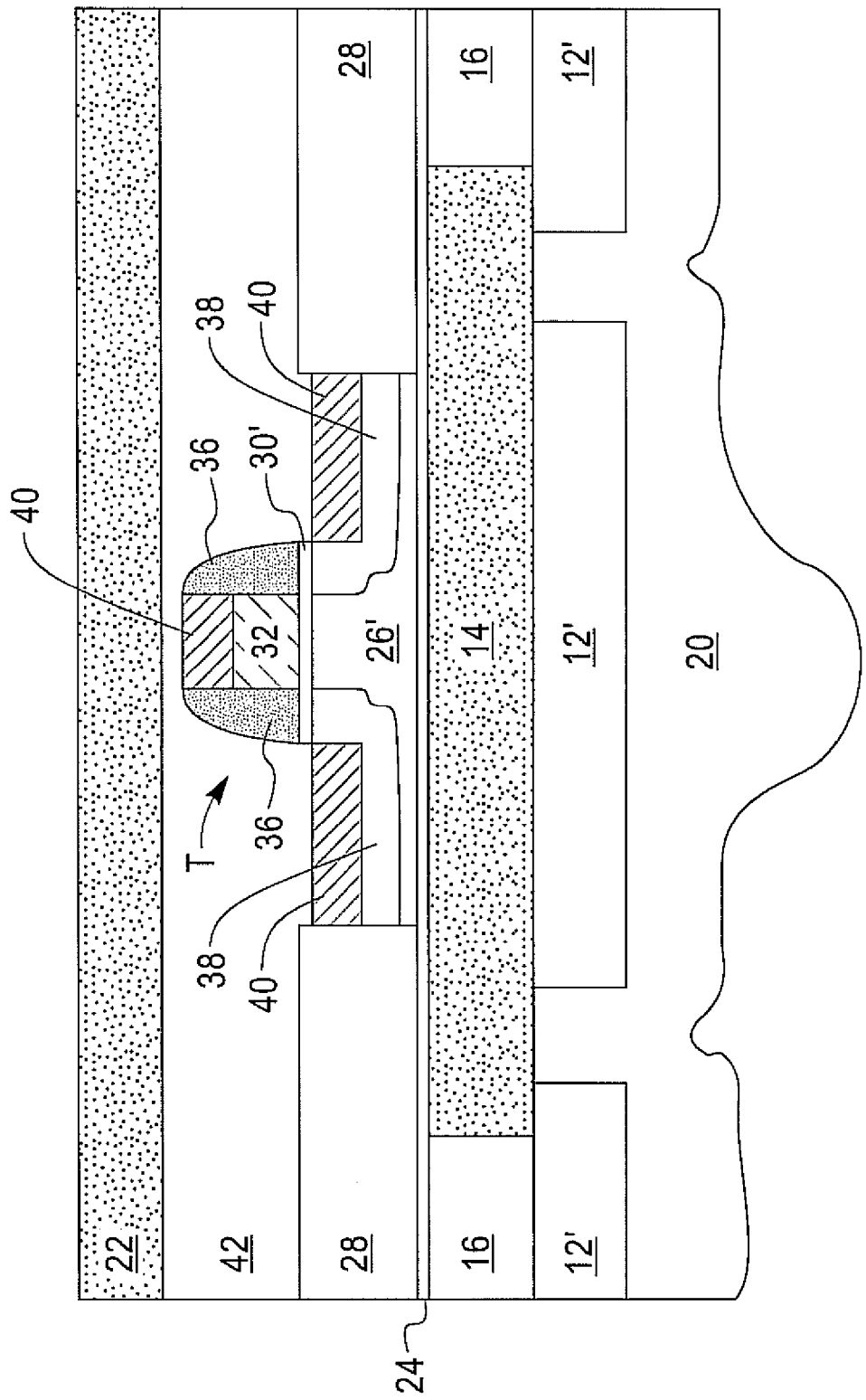

FIG. 23 shows a metal-semiconductor alloy forming metal layer 20 located upon the bottom of the semiconductor structure whose schematic cross-sectional diagram is illustrated in FIG. 22. This particular processing corresponds with the processing that is illustrated in FIG. 15 within the third embodiment.

Figure 24:
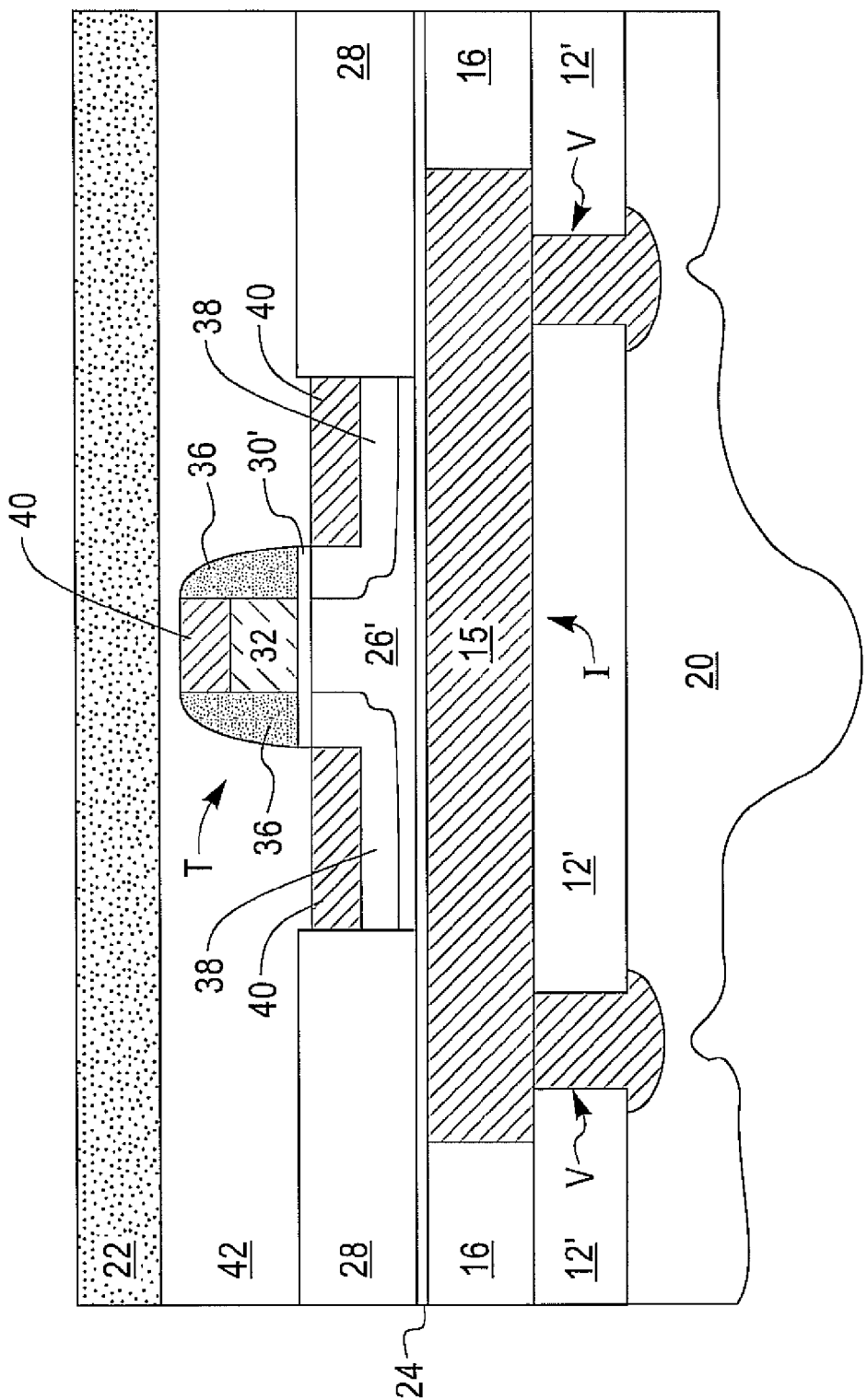

FIG. 24 shows a metal-semiconductor alloy layer 15 that results from reaction of the metal-semiconductor alloy forming metal layer 20 and the surface semiconductor layer 14. This particular processing corresponds with the processing that is illustrated in FIG. 16 within the third embodiment.

Figure 25:
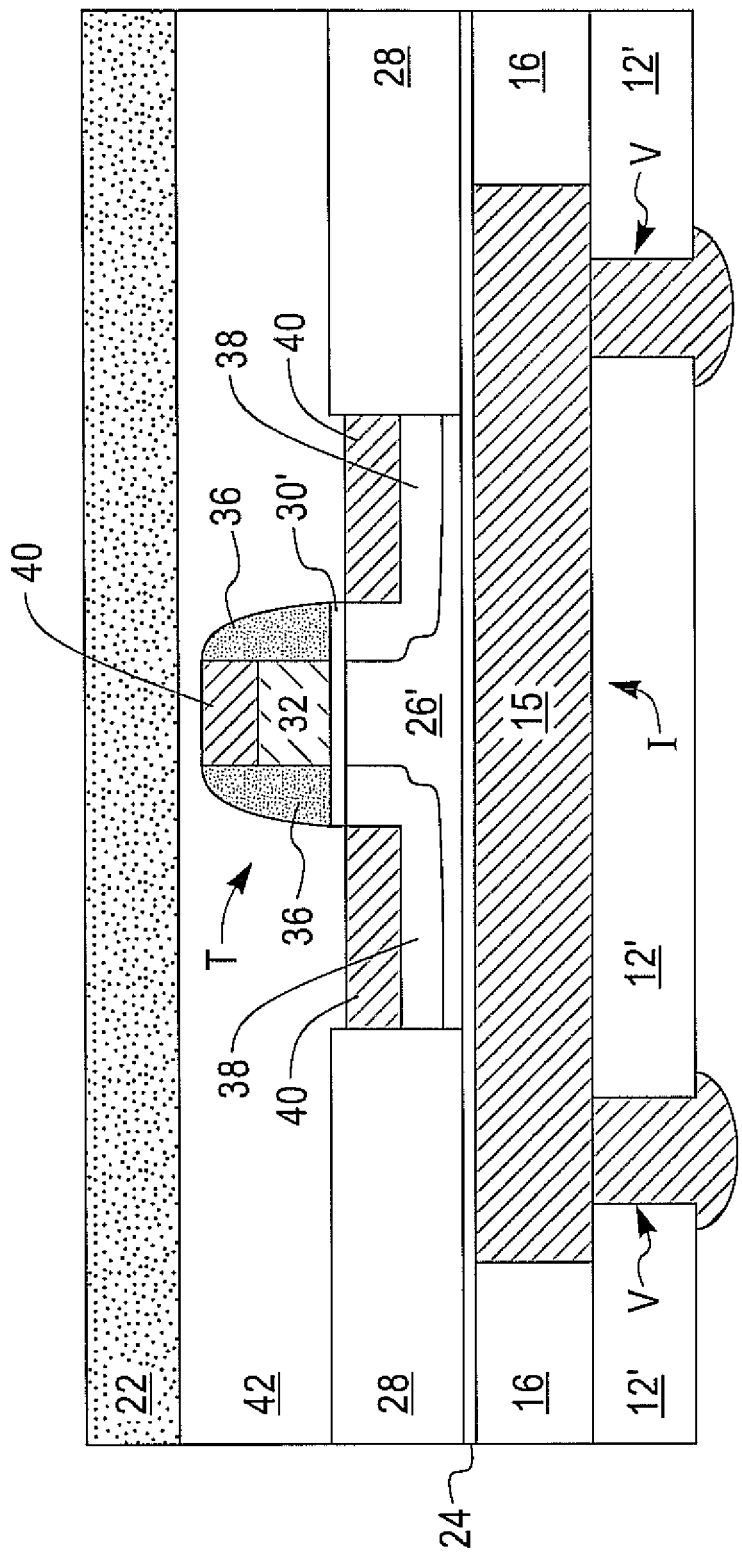

FIG. 25 shows the results of stripping unreacted excess portions of the metal-semiconductor alloy forming metal layer 20 from the semiconductor structure whose schematic cross-sectional diagram is illustrated in FIG. 24. This particular processing corresponds with the processing that is illustrated in FIG. 17 within the third embodiment.

FIG. 25 shows a schematic cross-sectional diagram of a semiconductor structure in accordance with a fourth embodiment of the invention. This particular semiconductor structure includes a metal-semiconductor alloy layer 15 having desirable characteristics identical to the metal-semiconductor alloy layer 15 that comprises the semiconductor structures in accordance with the first embodiment, second embodiment and third embodiment as illustrated in FIG. 5, FIG. 10 and FIG. 18. Similarly also with the third embodiment as is illustrated in FIG. 18, the metal-semiconductor alloy layer 15 is desirably formed after forming within the semiconductor structure a semiconductor device T (i.e., a transistor) including an active doped region.

As is understood by a person skilled in the art, the metal-semiconductor alloy layer 15 within the third embodiment as illustrated in FIG. 18 and the fourth embodiment as illustrated in FIG. 25 may be used as a back gate with respect to the transistor T. Alternatively, the metal-semiconductor alloy layer 15 within those embodiments may also be used under certain related circumstances as a capacitor plate. As is also understood by a person skilled in the art, the metal-semiconductor alloy layer 15 within any of the embodiments of the invention as illustrated in FIG. 5, FIG. 10, FIG. 18 and FIG. 26 may generally be used as a local interconnect. Finally, as is clear within all embodiments of the invention, the metal-semiconductor alloy layer 15 in accordance with the invention is not generally intended as located upon or formed within the context of a source/drain region.

The embodiments also contemplate semiconductor structures, and methods for fabrication thereof, with additional multiple vertically separated layers of semiconductor materials that are vertically separated by layers of dielectric materials. In furtherance of the foregoing embodiments, such additional vertically separated layers of semiconductor materials may not necessarily be intended solely for forming metal-semiconductor alloy layers horizontally, but rather might alternatively be used (i.e., after forming a via portion of a metal-semiconductor alloy layer) for vertically connecting and interconnecting the additional vertically separated semiconductor layers, or alternatively vertically separated devices (or interconnections thereto), where such devices may include, but are not limited to, semiconductor devices, micro-electro-mechanical system (MEMS) devices and optical devices.

The preferred embodiments of the invention are illustrative of the invention rather than limiting of the invention. Revisions and modifications may be made to methods, materials, structures and dimensions of a semiconductor structure in accordance with the preferred embodiments, while still fabricating a semiconductor structure in accordance with the invention, further in accordance with the accompanying claims.

What is claimed is:

1. A microelectronic structure comprising a metal silicide consisting essentially of a semiconductor element and a metal element selected from the group consisting of nickel, cobalt, iron, titanium, tungsten, erbium, ytterbium, platinum, vanadium, and combinations thereof, the metal silicide located interposed between a buried dielectric layer of a substrate and a dielectric capping layer, the metal silicide comprising an interconnect portion of a single material layer beneath the capping layer and two via portions that are contiguous with the interconnect portion and penetrating through the capping layer, wherein one of the two via portions is present at each end of the interconnect portion, wherein at least the interconnect portion of the metal silicide is free of stress and wherein an entirety of a bottommost surface of said interconnect portion of said metal silicide is in direct contact with an uppermost surface of said buried dielectric layer of a substrate.

2. The microelectronic structure of claim 1 wherein at least one of the two via portions serves as a vertical interconnect for at least one of a vertically separated semiconductor layer and a vertically separated device within the semiconductor structure.

3. The microelectronic structure of claim 1 wherein the metal silicide is included within at least one of a purely electronic microelectronic structure, a microelectromechanical system (MEMS) structure and an optoelectronic structure.

4. The microelectronic structure of claim 1, further comprising an isolation region present at each end of said interconnect portion.

5. The microelectronic structure of claim 4, wherein said isolation region is in direct contact with an outer sidewall of said interconnect portion.

6. The microelectronic structure of claim 4, wherein a bottom portion of said dielectric capping layer contacts a portion of a topmost surface of said isolation region.

7. The microelectronic structure of claim 1, wherein a topmost surface of at least one of said via portions is above a plane of the topmost surface of said dielectric capping layer.

8. The microelectronic structure of claim 7, wherein a topmost surface of said two via portions is above a plane of the topmost surface of said dielectric capping layer.

9. The microelectronic structure of claim 1, wherein said substrate is a semiconductor-on-insulator substrate comprising a base semiconductor substrate, said buried dielectric layer and a surface semiconductor layer.

10. The microelectronic structure of claim 1, wherein said substrate is a hybrid orientation (HOT) substrate, wherein said HOT substrate has at least two crystallographic orientations.

11. A microelectronic structure comprising a metal silicide comprising a semiconductor element and a metal element, the metal silicide located interposed between a buried dielectric layer of a substrate and a dielectric capping layer, the metal silicide comprising two interconnect portions beneath the capping layer and two via portions that are contiguous with the two interconnect portions and penetrate through said dielectric capping layer, wherein one of the two via portions is present on an end portion of each of the interconnect portions, wherein at least the interconnect portions of the metal silicide is free of stress and wherein an entirety of a bottommost surface of said interconnect portions of said metal silicide is in direct contact with an uppermost surface of said buried dielectric layer of a substrate.

12. The microelectric structure of claim 11, wherein said metal element is selected from the group consisting of nickel, cobalt, iron, titanium, tungsten, erbium, ytterbium, platinum, vanadium, and combinations thereof.

* * * * *